US012803683B2

(12) United States Patent
Nishioka et al.

(10) Patent No.: US 12,803,683 B2
(45) Date of Patent: Nov. 17, 2026

(54) PRE-EQUALIZED WAVEFORM GENERATION DEVICE, WAVEFORM COMPRESSION DEVICE, AND PRE-EQUALIZED WAVEFORM GENERATION METHOD

(71) Applicant: Mitsubishi Electric Corporation, Tokyo (JP)

(72) Inventors: Junya Nishioka, Tokyo (JP); Yoshiaki Konishi, Tokyo (JP); Takatoshi Akamatsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 24 days.

(21) Appl. No.: 18/945,743

(22) Filed: Nov. 13, 2024

(65) Prior Publication Data

US 2025/0070893 A1 Feb. 27, 2025

Related U.S. Application Data

(63) Continuation of application No. PCT/JP2022/028556, filed on Jul. 25, 2022.

(51) Int. Cl.

*H04B 17/11* (2015.01)
*H03M 7/32* (2006.01)
*H04B 17/21* (2015.01)

(52) U.S. Cl.

CPC .......... *H04B 17/11* (2015.01); *H03M 7/3002* (2013.01); *H04B 17/21* (2015.01)

(58) Field of Classification Search

CPC .......... H04B 17/11; H04B 1/16; H04B 17/21; H04B 10/50; H04B 10/079; H03M 7/3002

See application file for complete search history.

(56) References Cited

U.S. PATENT DOCUMENTS

2005/0190100 A1* 9/2005 Hester .................... G01S 7/4004 342/174
2014/0254619 A1* 9/2014 Ataie .................... H04B 10/506 372/28

(Continued)

FOREIGN PATENT DOCUMENTS

JP 11-84323 A 3/1999
JP 2013-178374 A 9/2013

OTHER PUBLICATIONS

International Search Report (PCT/ISA/210), issued in PCT/JP2022/028556, dated Oct. 11, 2022.

(Continued)

*Primary Examiner* — Syed Haider

(74) *Attorney, Agent, or Firm* — Birch, Stewart, Kolasch & Birch, LLP

(57) ABSTRACT

A pre-equalized waveform generation device includes: a calibration waveform data outputting unit to output first waveform data for calibration and second waveform data for calibration represented by an expression having a different order of a time variable from an expression representing the first waveform data; a compression waveform data acquiring unit to acquire first compression waveform data modulated using the first waveform data and compressed via a compression transmission path and to acquire second compression waveform data modulated using the second waveform data and compressed via the compression transmission path; a compression characteristic estimating unit to estimate a compression characteristic of the compression transmission path by using the first compression waveform data and the second compression waveform data; and a pre-equalization calculation unit to calculate pre-equalized waveform data by using ideal compression waveform data generated on the (Continued)

basis of a signal waveform and the compression characteristic.

13 Claims, 21 Drawing Sheets

(56) References Cited

U.S. PATENT DOCUMENTS

| | | | | |
|---|---|---|---|---|
| 2015/0333850 | A1* | 11/2015 | Myoung ................ | H04B 17/11 455/84 |
| 2020/0092153 | A1* | 3/2020 | Sarkas ................. | H03G 3/3036 |
| 2024/0283544 | A1* | 8/2024 | Nakamura ............. | H04B 10/58 |

OTHER PUBLICATIONS

Konishi et al., "Photonic-Assisted Digital-to-Analog Conversion Taking Advantage of Low Frequency Technology" 2021 International Topical Meeting on Microwave Photonics (MWP), IEEE, DOI: 10.1109/MWP53341.2021.9639411, Nov. 2021, Total 3 pages.

* cited by examiner

PRE-EQUALIZED WAVEFORM GENERATION DEVICE, WAVEFORM COMPRESSION DEVICE, AND PRE-EQUALIZED WAVEFORM GENERATION METHOD

CROSS REFERENCE TO RELATED APPLICATIONS

This application is a Continuation of PCT International Application No. PCT/JP2022/028556, filed on Jul. 25, 2022, which is hereby expressly incorporated by reference into the present application.

TECHNICAL FIELD

The present disclosure relates to a pre-equalized waveform generation technique for pre-equalizing a signal to be subjected to waveform compression.

BACKGROUND ART

Among techniques using analog signals, there is a technique in which a waveform is compressed and used.

For example, Non-Patent Literature 1 discloses that a waveform of a signal used in an optical communication technique is compressed and output.

Specifically, in Non-Patent Literature 1, pulsed light on which a signal waveform is superimposed is compressed via a compression transmission path containing a wavelength dispersion substance (hereinafter also simply referred to as a "dispersion substance").

CITATION LIST

Non-Patent Literatures

Non-Patent Literature 1: T. Konishi, et. al. "Photonic-assisted digital-to-analog conversion taking advantage of low frequency technology," 2021 MWP, We 1.1 (Invited), November 2021).

SUMMARY OF INVENTION

Technical Problem

However, it is conventionally difficult to output a waveform compressed at a uniform compression ratio as a whole when compressing the waveform. For example, in the compression transmission path of Non-Patent Literature 1, wavelength dispersion in the dispersion substance is not completely linear, and has a nonlinear compression characteristic. Therefore, in the conventional technique, there is a problem that when the waveform is compressed by the compression transmission path, a compression waveform in which distortion occurs due to excessive compression or insufficient compression may be output.

The present disclosure has been made to solve the above problem, and an object thereof is to provide a pre-equalized waveform generation technique for generating a pre-equalized waveform capable of suppressing distortion in a compression waveform.

Solution to Problem

A pre-equalized waveform generation device according to the present disclosure includes: a processor; and a memory storing a program, upon executed by the processor, to perform a process: to output first waveform data for calibration and second waveform data for calibration represented by an expression having a different order of a time variable from an expression representing the first waveform data; to acquire first compression waveform data indicating a waveform modulated using the first waveform data and compressed via a compression transmission path and to acquire second compression waveform data indicating a waveform modulated using the second waveform data and compressed via the compression transmission path; to estimate a compression characteristic that is a characteristic of the compression transmission path by using the first compression waveform data and the second compression waveform data; and to calculate pre-equalized waveform data by using ideal compression waveform data generated on a basis of a signal waveform and the compression characteristic.

Advantageous Effects of Invention

According to the present disclosure, it is possible to provide a pre-equalized waveform generation technique for generating a pre-equalized waveform capable of suppressing distortion in a compression waveform.

DESCRIPTION OF EMBODIMENTS

Hereinafter, in order to describe the present disclosure in more detail, embodiments of the present disclosure will be described with reference to the accompanying drawings.

First Embodiment

Figure 1:
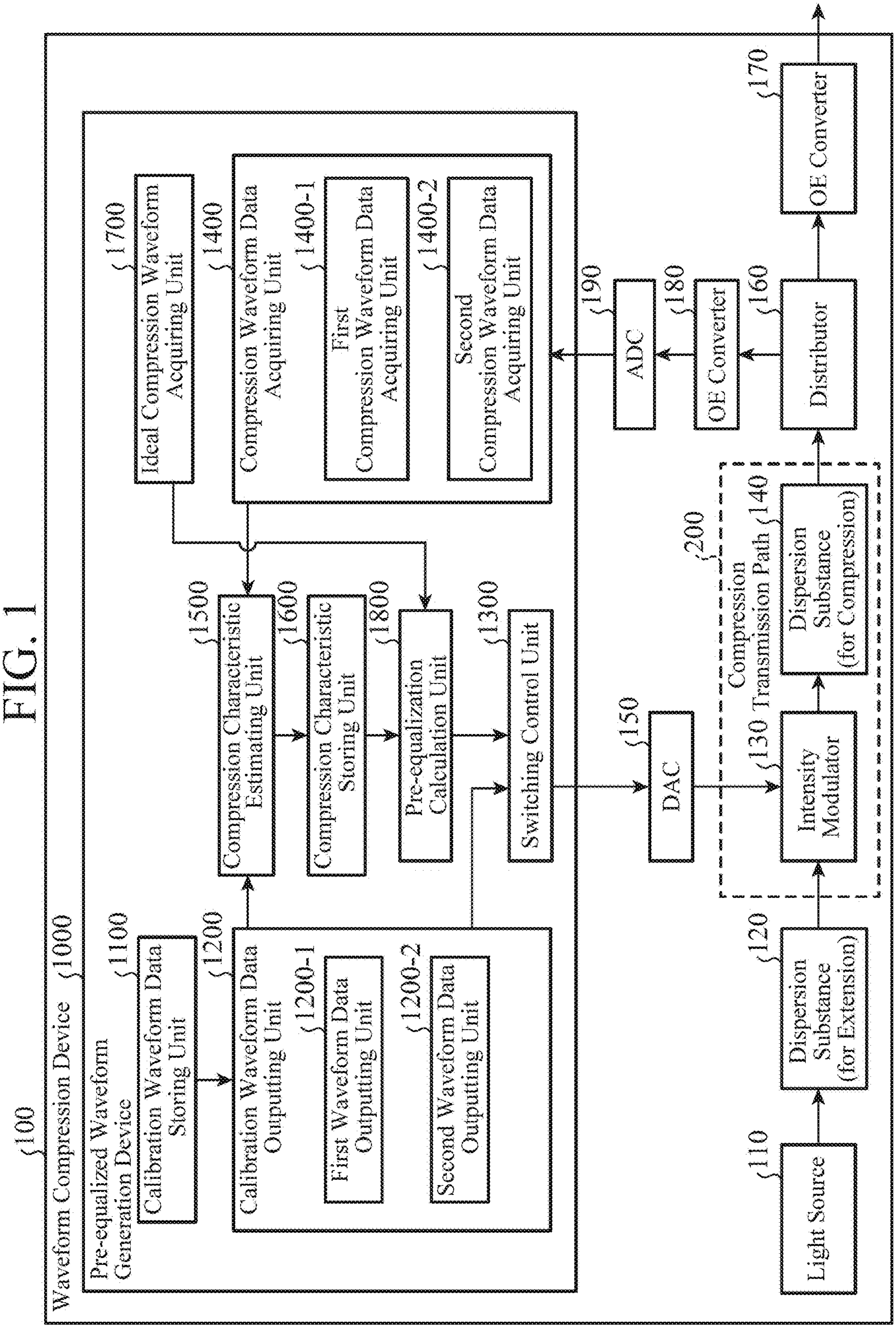
FIG. 1 is a diagram illustrating a configuration example of a waveform compression device including a pre-equalized waveform generation device according to a first embodiment of the present disclosure.

FIG. 1 is a diagram illustrating a configuration example of a waveform compression device 100 including a pre-equalized waveform generation device 1000 according to a first embodiment of the present disclosure.

The waveform compression device 100 includes a compression transmission path 200 including an intensity modulator 130 and a dispersion substance 140, compresses a waveform modulated by the intensity modulator 130 via the compression transmission path 200, and outputs a compressed compression waveform.

The waveform compression device 100 illustrated in FIG. 1 compresses and outputs a signal waveform using a light pulse, for example. Hereinafter, a configuration in which the signal waveform using the light pulse is compressed and output will be described as an example.

Specifically, the waveform compression device 100 illustrated in FIG. 1 includes a light source 110, a dispersion substance (dispersion substance for extension) 120, the intensity modulator 130, the dispersion substance (dispersion substance for compression) 140, a digital-to-analog converter (DAC) 150, a distributor 160, an OE converter (first OE converter) 170, an OE converter (second OE converter) 180, an analog-to-digital converter (ADC) 190, and the pre-equalized waveform generation device 1000.

The light source 110 illustrated in FIG. 1 is a waveform source that generates a waveform. The waveform generated by the light source 110 is used to superimpose any signal (for example, a signal arbitrarily set by a user) by a subsequent configuration. The light source 110 emits, for example, short-pulsed light.

Hereinafter, the short-pulsed light emitted from the light source 110 is also referred to as "light" or "light wave".

The dispersion substance 120 is a dispersion substance for waveform extension.

In the configuration illustrated in FIG. 1, the light from the light source 110 is extended (pulse extended) because time until the light is output from the dispersion substance 120 differs for each wavelength of the light.

That is, the dispersion substance 120 extends the light from the light source 110 and outputs the extended light to the intensity modulator 130.

The intensity modulator 130 performs intensity modulation on the light wave input via the dispersion substance 120 with a waveform input via the digital-to-analog converter 150.

Specifically, the intensity modulator 130 performs intensity modulation on a waveform of the light wave received via the dispersion substance 120 by using the waveform received from the pre-equalized waveform generation device 1000 via the digital-to-analog converter 150, and outputs the modulated light to the dispersion substance 140. The intensity modulator 130 in FIG. 1 is a light intensity modulator.

The dispersion substance 140 is a dispersion substance for waveform compression.

The dispersion substance 140 compresses and outputs a waveform of the input light wave.

The intensity modulator 130 and the dispersion substance 140 constitute the compression transmission path 200 in the present disclosure.

The digital-to-analog converter (DAC) 150 converts input waveform data (digital data) into an analog waveform.

The digital-to-analog converter 150 illustrated in FIG. 1 receives and converts the waveform data (digital data for each time t) output from the pre-equalized waveform generation device 1000 into an analog waveform, and outputs the waveform to the intensity modulator 130.

The distributor 160 is disposed on the transmission path and extracts a part of the light wave passing through the transmission path.

The distributor 160 illustrated in FIG. 1 is an optical distributor disposed at a subsequent stage of the compression transmission path 200, and extracts and outputs a part of the light wave output from the compression transmission path to the OE converter 170.

The OE converter 170 converts the light wave into an electric signal.

The OE converter 170 illustrated in FIG. 1 is disposed between the distributor 160 and an external output terminal (not illustrated), converts the light wave output by the distributor 160 into an electric signal, and outputs the electric signal to the outside of the waveform compression device 100. The OE converter 170 includes, for example, a photodiode.

The OE converter 170 shown in FIG. 1 is a first OE converter in the present disclosure.

The OE converter 180 converts the light wave into an electric signal.

The OE converter 180 illustrated in FIG. 1 is disposed between the distributor 160 and the ADC, converts the light wave output by the distributor 160 into an electric signal, and outputs the electric signal to the ADC 190. The OE converter 180 includes, for example, a photodiode.

The OE converter 180 shown in FIG. 1 is a second OE converter in the present disclosure.

The analog-to-digital converter (ADC) 190 converts an analog waveform indicated by the input electric signal into waveform data (digital data).

The analog-to-digital converter 190 illustrated in FIG. 1 receives the electric signal indicating the compression waveform compressed by the compression transmission path 200, performs sampling (for example, sampling for each sampling time T) to convert the signal into compression waveform data that is time-series digital data, and outputs the converted compression waveform data to the pre-equalized waveform generation device 1000.

The pre-equalized waveform generation device 1000 estimates a compression characteristic that is a characteristic of the compression transmission path 200, and generates a pre-equalized waveform capable of suppressing distortion of the compression waveform using the compression characteristic.

The pre-equalized waveform generation device 1000 is implemented by, for example, a digital signal processor (DSP).

The pre-equalized waveform generation device 1000 includes a calibration waveform data storing unit 1100, a calibration waveform data outputting unit 1200, a switching control unit 1300, a compression waveform data acquiring unit 1400, a compression characteristic estimating unit 1500, a compression characteristic storing unit 1600, an ideal compression waveform acquiring unit 1700, a pre-equalization calculation unit 1800, and a control unit (not illustrated).

The control unit (not illustrated) instructs, for example, activation of the entire pre-equalized waveform generation device 1000 and activation of each component.

The calibration waveform data storing unit 1100 stores calibration waveform data output by the calibration waveform data outputting unit. A data format of the waveform data stored in the calibration waveform data storing unit 1100 is not particularly limited as long as the waveform data can be represented. The waveform data may be, for example, in the form of a function, or may be waveform data itself including a combination of an amplitude value of a waveform and a value of a time axis (index value).

The calibration waveform data outputting unit 1200 outputs a plurality of calibration waveform data represented by different functions. The calibration waveform data outputting unit 1200 outputs, for example, first waveform data for calibration and second waveform data for calibration represented by an expression having a different order of a time variable from an expression representing the first waveform data.

In addition, the calibration waveform data outputting unit 1200 outputs temporal resolution of the waveform data to be output or an index value for each sampling time timing based on the temporal resolution to the compression characteristic estimating unit 1500.

The calibration waveform data outputting unit 1200 illustrated in FIG. 1 includes, for example, a first waveform data outputting unit 1200-1 and a second waveform data outputting unit 1200-2.

The first waveform data outputting unit 1200-1 outputs first waveform data for calibration.

Specifically, the first waveform data outputting unit 1200-1 refers to, for example, the calibration waveform data storing unit 1100 and outputs first waveform data indicating a waveform represented by a constant function. In this case, for example, a waveform indicated in the first waveform data ("scal-a(τ)" to be described later) is represented by a constant function indicated by a constant a.

The second waveform data outputting unit 1200-2 outputs second waveform data for calibration.

Specifically, the second waveform data outputting unit 1200-2 refers to, for example, the calibration waveform data storing unit 1100 and outputs second waveform data indicating a waveform represented by a linear function. In this case, for example, a waveform indicated in the second waveform data ("scal-b(τ)" to be described later) is expressed by a linear function indicated by a constant b and a time t (time variable).

The switching control unit 1300 switches output of the pre-equalized waveform generation device 1000.

Specifically, for example, the switching control unit 1300 performs switching in such a manner that the second waveform data is output from the second waveform data outputting unit 1200-2 of the calibration waveform data outputting unit 1200 after the first waveform data is output from the first waveform data outputting unit 1200-1 of the calibration waveform data outputting unit 1200, and pre-equalized waveform data output from the pre-equalization calculation unit 1800 is output after all the waveform data is output from the calibration waveform data outputting unit 1200.

The compression waveform data acquiring unit 1400 acquires compression waveform data that is a waveform compressed via the compression transmission path.

The compression waveform data acquiring unit 1400 acquires first compression waveform data indicating a waveform modulated using the first waveform data and compressed via the compression transmission path, and acquires second compression waveform data indicating a waveform modulated using the second waveform data and compressed via the compression transmission path.

Specifically, the compression waveform data acquiring unit 1400 includes, for example, a first compression waveform data acquiring unit 1400-1 and a second compression waveform data acquiring unit 1400-2.

The first compression waveform data acquiring unit 1400-1 acquires first compression waveform data that is a waveform modulated by the intensity modulator 130 using the first waveform data and further indicates a waveform compressed via the compression transmission path 200. The first compression waveform data is digital data obtained by sampling the waveform compressed via the compression transmission path 200 at an interval of the sampling time T by the analog-to-digital converter 190.

The second compression waveform data acquiring unit 1400-2 acquires second compression waveform data that is a waveform modulated by the intensity modulator 130 using the second waveform data and further indicates a waveform compressed via the compression transmission path 200. The second compression waveform data is digital data obtained by sampling the waveform compressed via the compression transmission path 200 at an interval of the sampling time T by the analog-to-digital converter 190.

The compression characteristic estimating unit 1500 estimates a compression characteristic of the compression transmission path 200.

The compression characteristic estimating unit 1500 estimates and outputs a compression characteristic that is a characteristic of the compression transmission path 200 by using the first compression waveform data and the second compression waveform data.

Specifically, using a differential value of a compression function (hereinafter also referred to as "compression function differential value"), sampling time timing of input waveform data, a value (compression function value) obtained by upsampling a value of the compression function (hereinafter also referred to as "compression function value"), and a sampling time timing of the upsampled compression function value, the compression characteristic estimating unit 1500 extracts sampling time timing after upsampling corresponding to the sampling time timing of the input waveform data, and further extracts a compression function differential value at the extracted sampling time timing. The compression characteristic estimating unit 1500 outputs a compression characteristic including the extracted sampling time timing and the compression function differential value at the sampling time timing.

Note that the compression function indicates a temporal change in an expression in which an output waveform with reference to the compression transmission path 200 is represented by an input waveform. Details will be described later.

The characteristic of the compression transmission path 200 can be expressed, for example, in a format using a compression function related to time ("g(t)" to be described later) and a compression function differential ("g'(t)" to be described later) so as to equalize a relationship between the input waveform and the output waveform with reference to the compression transmission path 200. In this case, a compression waveform ("A(t)" to be described later) which is the output waveform can be expressed by, for example, Expression (1) to be described later using a waveform before compression ("s(t)" to be described later), the compression function related to time ("g(t)" to be described later), and the compression function differential ("g'(t)" to be described later). Note that the above "t" indicates a time value (sampling time timing value of digital data) on a time axis of each of the compression waveform ("A(t)" to be described later), the waveform before compression ("s(t)" to be described later), and the compression function ("g(t)" to be described later) and the compression function differential ("g'(t)" to be described later).

For example, the compression characteristic estimating unit 1500 outputs a combination of a compression function differential value ("g'(t)" to be described later) obtained by upsampling the compression function differential value obtained from the first compression waveform data and an index value "t" indicating each sampling time timing value.

In addition, for example, the compression characteristic estimating unit 1500 upsamples a compression function value obtained from the second compression waveform data and the compression function differential value, and outputs a time timing value "tk" in a case where the upsampled compression function value ("g(t)" to be described later) and a sampling time timing value "τk" of the calibration waveform data match ("match" includes nearest).

The compression characteristic and an example of an internal configuration of the compression characteristic estimating unit 1500 will be described later.

The compression characteristic storing unit 1600 stores a compression characteristic.

The compression characteristic storing unit 1600 acquires and stores the compression function differential value ("g'(t)" to be described later) for each sampling time timing value "t" and the time timing value "tk" indicating the compression characteristic estimated by the compression characteristic estimating unit 1500. The compression function differential value ("g'(t)" to be described later) for each sampling time timing value "t" is stored, for example, in the form of a data table including the sampling time timing value "t" and the compression function differential value ("g'(t)" to be described later).

In addition, the compression characteristic storing unit 1600 may further store data used in compression characteristic estimation processing, such as the compression function value ("g(t)" to be described later), in the data table.

Since the pre-equalized waveform generation device 1000 including the compression characteristic storing unit 1600 can store the compression characteristic of the compression transmission path 200, pre-equalized waveform data can be generated for any waveform data input from the outside of the device by using the stored compression characteristic.

In addition, the pre-equalized waveform generation device 1000 including the compression characteristic storing unit 1600 can reduce a processing load by not repeatedly performing processing related to the estimation of the compression characteristic.

Note that the pre-equalized waveform generation device 1000 may be configured without the compression characteristic storing unit 1600. In this case, the pre-equalized waveform generation device 1000 is configured in such a manner that the pre-equalization calculation unit 1800 to be described later executes pre-equalization calculation processing by using the compression characteristic temporarily stored in the compression characteristic estimating unit 1500.

The ideal compression waveform acquiring unit 1700 acquires an ideal compression waveform based on any waveform data.

The ideal compression waveform acquiring unit 1700 may be configured to calculate and acquire an ideal compression waveform from any waveform data, may be configured to acquire an ideal compression waveform from any waveform data (compression waveform data) that has already been compressed, or may be configured to acquire ideal compression waveform data itself from the outside of the device.

The ideal compression waveform acquiring unit 1700 outputs ideal compression waveform data ("Aideal(t)" to be described later).

An example of an internal configuration of the ideal compression waveform acquiring unit 1700 will be described later.

The pre-equalization calculation unit 1800 has a function of calculating pre-equalized waveform data.

The pre-equalization calculation unit 1800 illustrated in FIG. 1 calculates pre-equalized waveform data by acquiring and using the compression characteristic from the compression characteristic storing unit 1600.

The pre-equalization calculation unit 1800 calculates pre-equalized waveform data ("scal(τk)" (k=1, 2, 3, . . . ) to be described later) by using the ideal compression waveform data ("Aideal(t)" (t=t1, t2, t3, . . . ) to be described later)

generated on the basis of any signal waveform and the compression characteristic (information including the compression function differential value "g'(t)" (t=t1, t2, t3, . . . ), the sampling time timing value "τk" (k=1, 2, 3, . . . ), and the sampling time timing value "tk" (k=1, 2, 3, . . . ) to be described later) estimated by the compression characteristic estimating unit 1500.

In other words, the pre-equalization calculation unit 1800 calculates the pre-equalized waveform data ("scal(τk)") by dividing the ideal compression waveform data ("Aideal(t)") by the compression function differential value ("g'(t)") for each sampling time timing ("tk" corresponding to "τk" (k=1, 2, 3, . . . )) extracted by the compression characteristic estimating unit 1500.

An example of an internal configuration of the pre-equalization calculation unit 1800 will be described later.

Here, an outline of a compression characteristic and pre-equalization in the present disclosure will be described.

Figure 2:
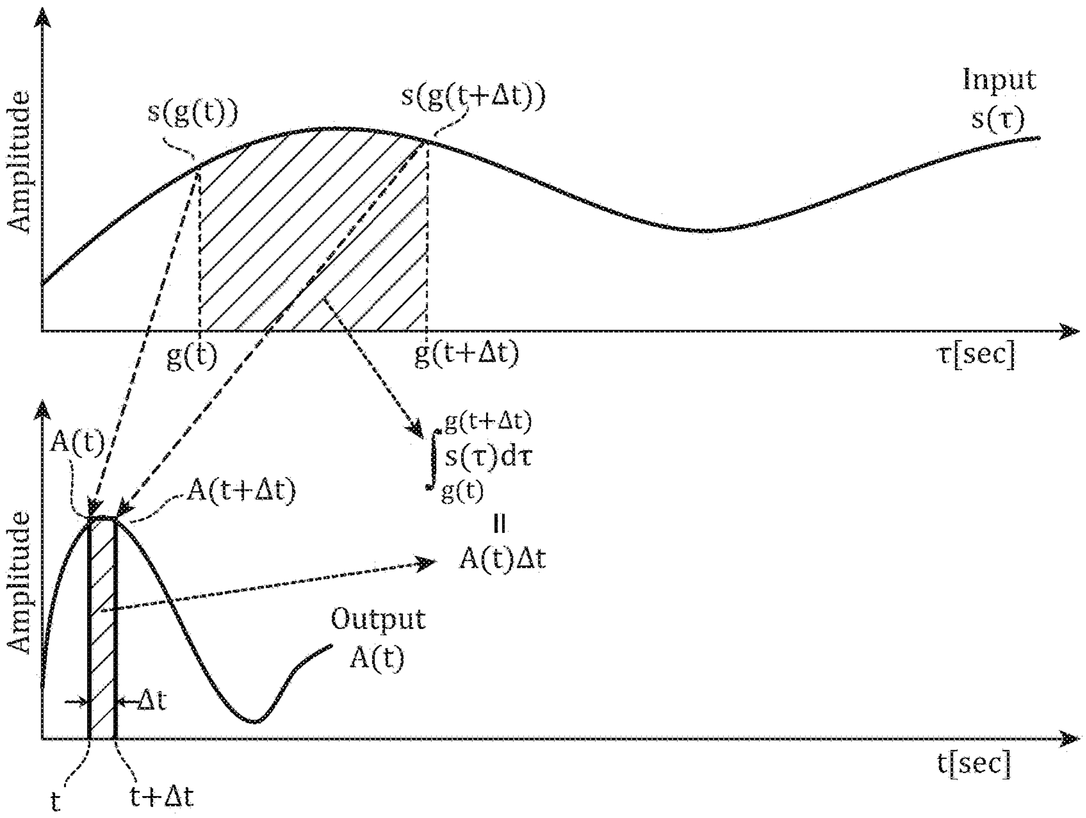
FIG. 2 is a diagram for explaining a compression characteristic and pre-equalization.

FIG. 2 is a diagram for explaining waveforms before and after compression.

An output waveform A(t) based on the compression transmission path can be expressed as Expression (1) with respect to an input waveform s(t) in consideration of a nonlinear compression characteristic of the compression transmission path (input and output relational expression of the compression transmission path).

$$A(t)=s(g(t))g'(t) \tag{1}$$

"g(t)" in Expression (1) is a function indicating time in a relationship between the output waveform and the input waveform, and is defined as "compression function" in the present disclosure. "g'(t)" is a differential of the compression function g(t).

That is, it can be said that the compression function g(t) and the compression function differential g'(t) represent a compression characteristic of the compression transmission path.

By using the first waveform data for calibration and the second waveform data for calibration represented by an expression having a different order of a time variable from the expression representing the first waveform data for the compression transmission path having such a compression characteristic, the compression function differential g'(t) and the compression function g(t) can be estimated.

For example, it is assumed that a waveform of the first waveform data is a waveform represented by a constant function as shown in Expression (2), and a waveform of the second waveform data is a waveform represented by a linear function as shown in Expression (3).

$$s_{cal-a}(t)=a \tag{2}$$

$$s_{cal-b}(t)=bt \tag{3}$$

Here, "t" in Expressions (2) and (3) is specifically a sampling time timing value "τ" of each sampling data based on temporal resolution of the waveform data.

When first compression waveform data Acal-a(t) modulated using the first waveform data and compressed via the compression transmission path 200 and second compression waveform data Acal-b(t) modulated using the second waveform data and compressed via the compression transmission path 200 can be acquired, the compression function differential g'(t) can be expressed as Expression (4), and further, the compression function g(t) can be expressed as Expression (5) using Expression (4).

$$g'(t)=\frac{A_{cal-a}(t)}{a} \tag{4}$$

$$g(t)=\frac{A_{cal-b}(t)}{g'(t)b}=\frac{a}{b}\frac{A_{cal-b}(t)}{A_{cal-a}(t)} \tag{5}$$

Here, "t" in the first compression waveform data Acal-a(t) and the second compression waveform data Acal-b(t) is specifically a sampling time timing value "T" of each sampling data based on temporal resolution of the compression waveform data.

Then, when the time "t" at which the sampling time timing value "t" and the compression function g(t) are equal can be estimated, pre-equalized waveform data for each sampling time timing value "τ" can be generated by a pre-equalized waveform expression scal(τ) defined as shown in Expression (6) by using the ideal compression waveform (ideal compression waveform) Aideal(t) and the compression function differential g'(t) at the sampling time timing value "t" corresponding to each sampling time timing value "τ".

$$s_{cal}(\tau)=\frac{A_{ideal}(t)}{g'(t)} \tag{6}$$

In the present disclosure, on the basis of such an idea, the compression characteristic of the compression transmission path 200 is estimated, and pre-equalization processing is performed on waveform data to be superimposed on a waveform before compression using the estimated compression characteristic.

Figure 3:
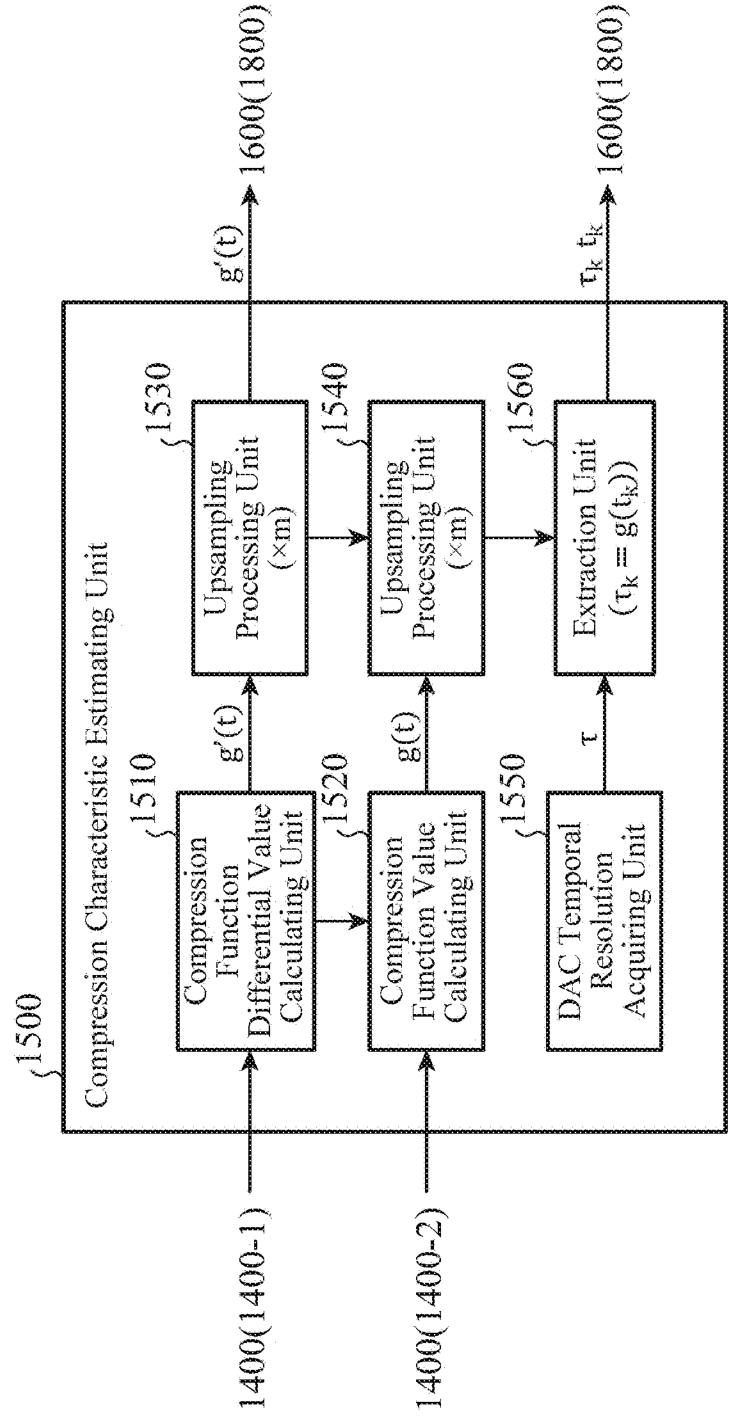
FIG. 3 is a diagram illustrating a configuration example of a compression characteristic estimating unit in the pre-equalized waveform generation device of FIG. 1.

FIG. 3 is a diagram illustrating a configuration example of the compression characteristic estimating unit 1500 in the pre-equalized waveform generation device 1000 of FIG. 1.

The compression characteristic estimating unit 1500 includes a compression function differential value calculating unit 1510, a compression function value calculating unit 1520, an upsampling processing unit 1530, an upsampling processing unit 1540, a DAC temporal resolution acquiring unit 1550, and an extraction unit 1560.

The compression function differential value calculating unit 1510 calculates a compression function differential value by using the first compression waveform data.

The compression function differential value calculating unit 1510 calculates a compression function differential value g'(T) by using, for example, first compression waveform data Acal-a(T) for each sampling time timing value T (T=T1, T2, T3, . . . ).

The compression function value calculating unit 1520 calculates a compression function value by using the compression function differential value and the second compression waveform data.

The compression function value calculating unit 1520 calculates a compression function value g(T) by using, for example, second compression waveform data Acal-b(T) for each sampling time timing value T (T=T1, T2, T3, . . . ).

The upsampling processing unit 1530 upsamples the compression function differential value g'(T) to increase the number of samples, and outputs an upsampled compression function differential value g'(t).

The upsampling processing unit 1530 performs upsampling processing in such a manner that the number of samples (the number sampled for each sampling time timing value T) of the compression function differential value g'(T) is increased to m times (m is any natural number) to interpolate data between the sampling time timings T, and outputs the upsampled compression function differential value g'(t) (t=t1, t2, t3, . . . ). The upsampling processing unit 1530 performs upsampling processing by performing linear interpolation, for example.

The upsampling processing unit 1540 upsamples the compression function value g(T) to increase the number of samples, and outputs an upsampled compression function value g(t).

The upsampling processing unit 1540 performs upsampling processing in such a manner that the number of samples (the number sampled for each sampling time timing value T) of the compression function value g(T) is increased to m times (m is any natural number) to interpolate data between the sampling time timings T, and outputs the upsampled compression function value g(t) (t=t1, t2, t3, . . . ). The upsampling processing unit 1540 performs upsampling processing by performing linear interpolation, for example.

The DAC temporal resolution acquiring unit 1550 acquires a sampling rate (sampling frequency) fmon of the digital-to-analog converter 150, and acquires a sampling time timing value τ of the digital-to-analog converter 150 by calculating a temporal resolution 1/fmon.

The extraction unit 1560 extracts an index value tk which is a sampling time timing value in such a manner that sampling time timing value τk=compression function value g(tk).

The extraction unit 1560 may be configured to extract the index value tk that is the sampling time timing value using the compression function value g(tk) closest to the sampling time timing value τk.

The extraction unit 1560 combines "τk" (k=1, 2, 3, . . . ) and "tk" (k=1, 2, 3, . . . ) in the order of k and outputs the combination to the pre-equalization calculation unit 1800 as corresponding time information.

Figure 4:
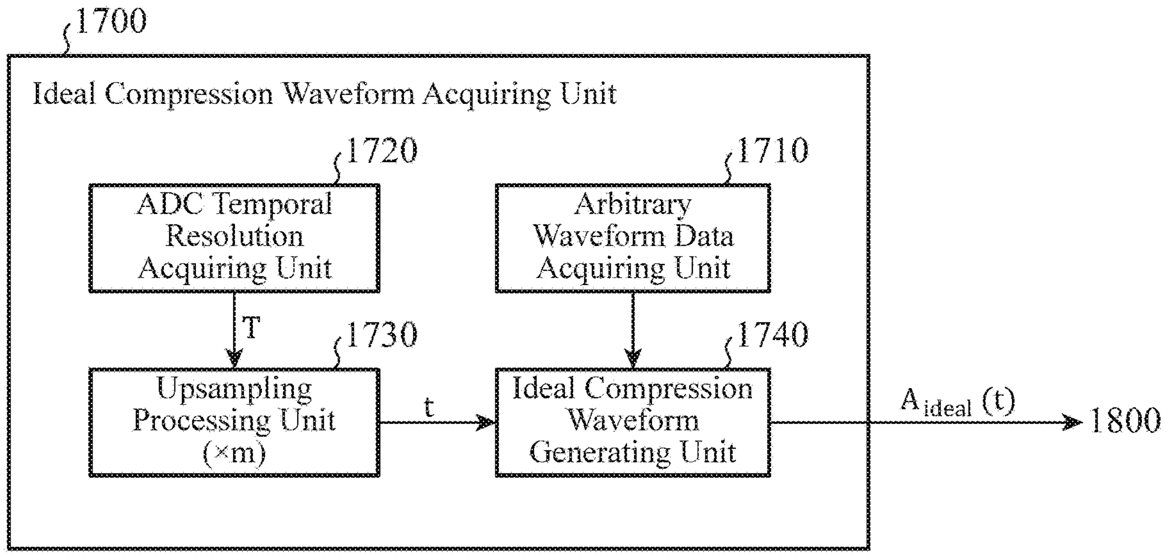
FIG. 4 is a diagram illustrating a configuration example of an ideal compression waveform acquiring unit in the pre-equalized waveform generation device of FIG. 1.

FIG. 4 is a diagram illustrating a configuration example of the ideal compression waveform acquiring unit 1700 in the pre-equalized waveform generation device 1000 of FIG. 1.

The ideal compression waveform acquiring unit 1700 illustrated in FIG. 4 is a configuration example in a case where an ideal compression waveform is calculated and acquired from any waveform data.

The ideal compression waveform acquiring unit 1700 includes an arbitrary waveform data acquiring unit 1710, an ADC temporal resolution acquiring unit 1720, an upsampling processing unit 1730, and an ideal compression waveform generating unit 1740.

The arbitrary waveform data acquiring unit 1710 acquires a signal waveform or signal waveform data.

The signal waveform or the signal waveform data indicates a waveform in an uncompressed state arbitrarily input by a user's operation or program.

The signal waveform or the signal waveform data may be input from the outside of the device.

Hereinafter, it is assumed that the arbitrary waveform data acquiring unit 1710 acquires signal waveform data (s(t), where "r" is a sampling time timing value of waveform data) in consideration of a communication load or a processing load.

The ADC temporal resolution acquiring unit 1720 acquires a sampling rate (sampling frequency) fdac of the analog-to-digital converter 190, and acquires a sampling time T of the compression waveform data output from the analog-to-digital converter 190 by calculating a temporal resolution 1/fdac.

The upsampling processing unit 1730 sets a sampling time t by, for example, linear interpolation in such a manner that the number of samples based on the sampling time T is upsampled to m times (m is any natural number).

The ideal compression waveform generating unit 1740 calculates ideal compression waveform data in a case where a waveform indicated in the signal waveform data is ideally linearly compressed, using the signal waveform data (s(τ)) and the sampling time "t".

Specifically, the ideal compression waveform generating unit 1740 assumes linear compression (g(t)=Rt) by using Expression (1), resamples the signal waveform data (s(t)) on the basis of the sampling time "t", and generates resampled signal waveform data (s(R×t)). The ideal compression waveform generating unit 1740 calculates ideal compression waveform data (Aideal(t)=s(R×)×) by using each value of the signal waveform data (s(R×t)). The ideal compression waveform generating unit 1740 outputs the ideal compression waveform data (Aideal(t)) to the pre-equalization calculation unit 1800.

Here, a configuration example in a case where the ideal compression waveform acquiring unit 1700 acquires an ideal compression waveform from compressed waveform data (compression waveform data) will be described.

In this case, the arbitrary waveform data acquiring unit 1710 acquires compression waveform data (A(T)) obtained by compressing the signal waveform data (s(T)).

In this case, the ideal compression waveform generating unit 1740 resamples the compression waveform data (A(T)) by using the sampling time "t". The ideal compression waveform generating unit 1740 performs upsampling processing (for example, upsampling processing by linear interpolation) when a sampling rate based on the sampling time "T" of the compression waveform data is lower than the sampling rate based on the time "t", and performs downsampling processing when the sampling rate based on the sampling time "T" of the compression waveform data is higher than the sampling rate based on the time "t".

Note that the ideal compression waveform acquiring unit 1700 may be configured to acquire ideal compression waveform data itself. When the ideal compression waveform acquired by the ideal compression waveform acquiring unit 1700 is the ideal compression waveform data itself, for example, a configuration other than the arbitrary waveform data acquiring unit is unnecessary, and the number of configurations can be reduced.

Figure 5:
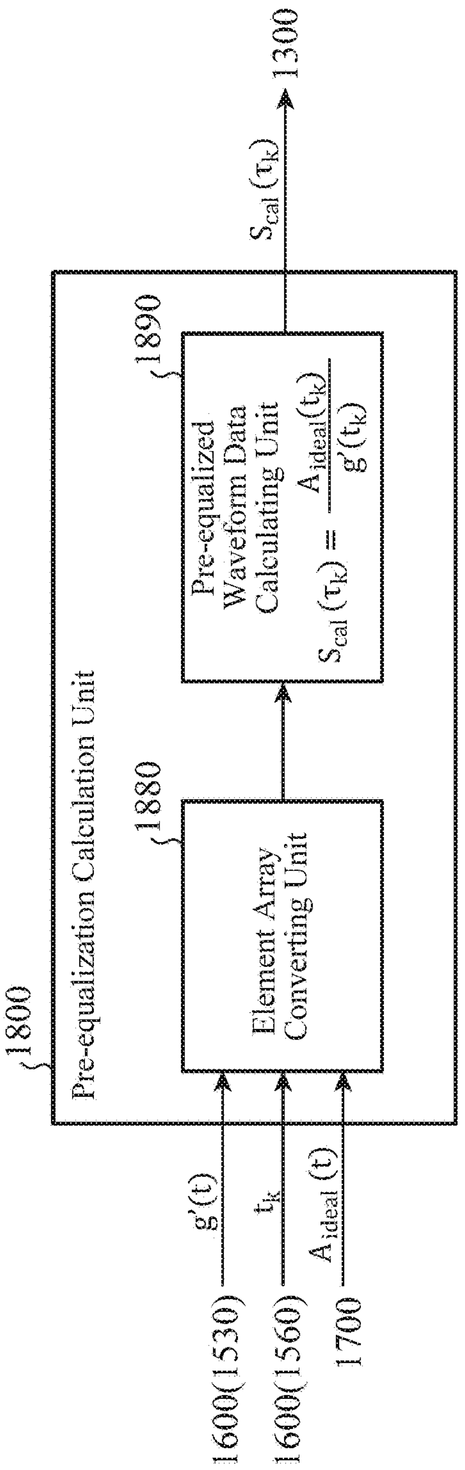
FIG. 5 is a diagram illustrating a configuration example of a pre-equalization calculation unit in the pre-equalized waveform generation device of FIG. 1.

FIG. 5 is a diagram illustrating a configuration example of the pre-equalization calculation unit 1800 in the pre-equalized waveform generation device 1000 of FIG. 1.

The pre-equalization calculation unit 1800 includes an element array converting unit 1880 and a pre-equalized waveform data calculating unit 1890.

The element array converting unit 1880 changes a correspondence relationship between data in such a manner as to associate the sampling time timing value (index value (τk)) of the waveform data output to the digital-to-analog converter 150, an ideal compression waveform data (Aideal (tk)), and a compression function differential value (g'(tk)).

Specifically, in a case where the data used in the pre-equalized waveform generation device 1000 is managed by the data table, the element array converting unit 1880 changes an element array in the data table in such a manner that the ideal compression waveform data (Aideal(tk)) and the compression function differential value (g'(tk)) are arranged in an element array of the index value (τk) in the order of k in a corresponding manner.

The pre-equalized waveform data calculating unit 1890 calculates pre-equalized waveform data (scal(τk)) by dividing the ideal compression waveform data (Aideal(tk)) by the compression function differential value (g'(tk)). The pre-equalized waveform data calculating unit 1890 outputs the pre-equalized waveform data (scal(τk)) to the digital-to-analog converter 150 via the switching control unit 1300.

An example of processing in the pre-equalized waveform generation device 1000 will be described.

In the description, the first waveform data and the second waveform data are used for the calibration waveform data, and a case where the waveform of the first waveform data is a waveform represented by a constant function and the waveform of the second waveform data is a waveform represented by a linear function is representatively used.

Figure 6:
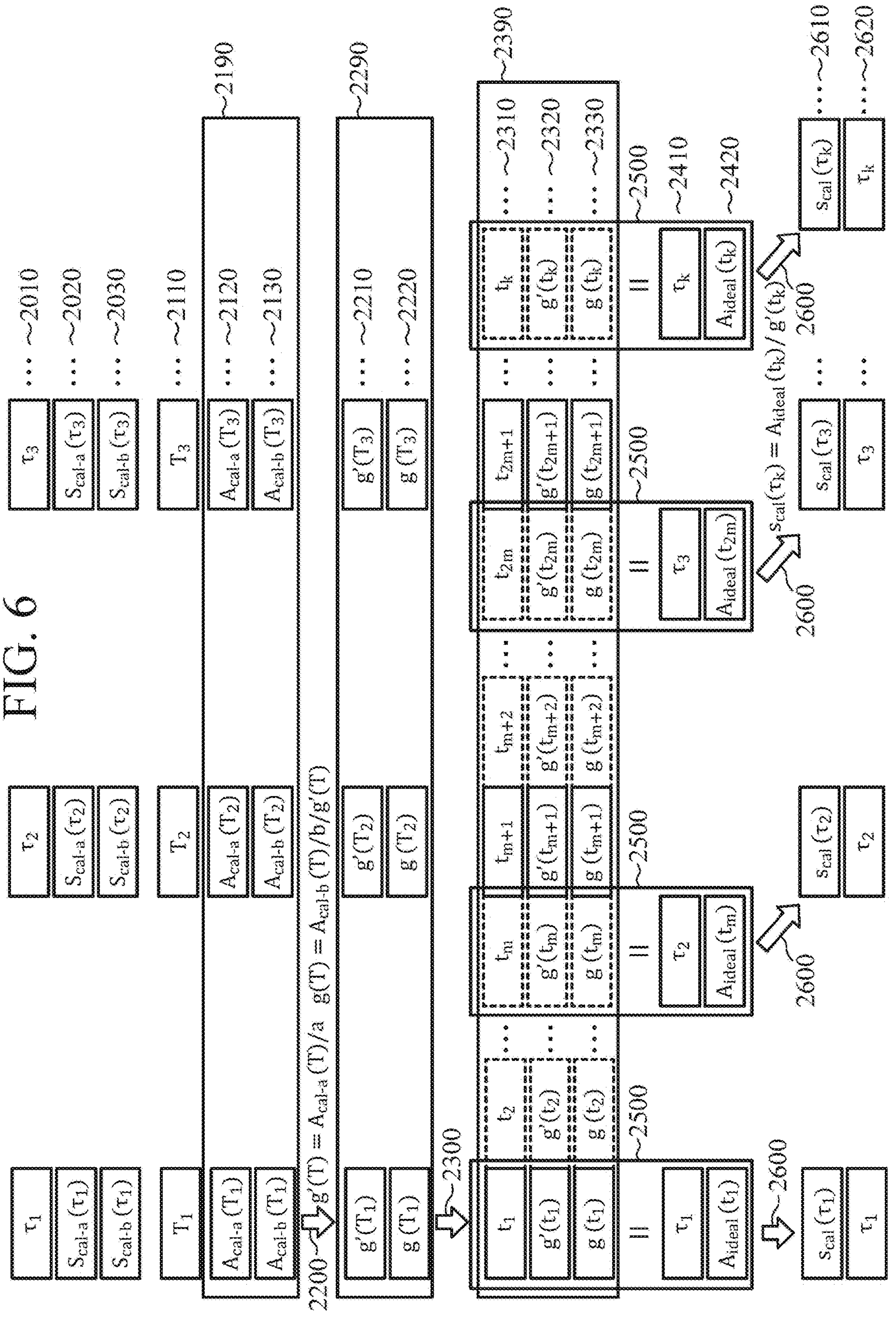
FIG. 6 is a diagram illustrating a relationship between data in processing performed by the pre-equalized waveform generation device.

FIG. 6 is a diagram illustrating a relationship between data in processing performed by the pre-equalized waveform generation device 1000.

Figure 7:
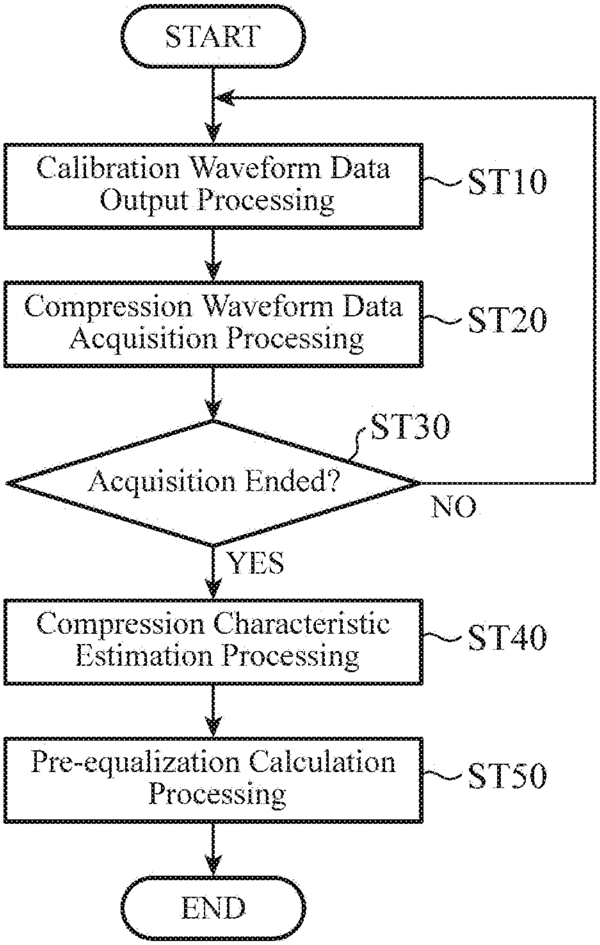
FIG. 7 is a flowchart illustrating an example of the processing performed by the pre-equalized waveform generation device.

FIG. 7 is a flowchart illustrating an example of the processing performed by the pre-equalized waveform generation device 1000.

For example, when the waveform compression device 100 is activated, the pre-equalized waveform generation device 1000 starts the processing illustrated in FIG. 7.

The pre-equalized waveform generation device 1000 executes calibration waveform data output processing (step ST10).

Specifically, the calibration waveform data outputting unit 1200 in the pre-equalized waveform generation device 1000 outputs first waveform data for calibration as shown in Expression (7) to the digital-to-analog converter 150. More specifically, the first waveform data outputting unit 1200-1 in the calibration waveform data outputting unit 1200 outputs first waveform data 2020 for calibration for each sampling time timing value τ (t=τ1, τ2, τ3, . . . ) (index value 2010) illustrated in FIG. 6.

$$s_{cal-a}(\tau) = a \tag{7}$$

Next, the calibration waveform data outputting unit outputs second waveform data for calibration as shown in Expression (8) to the digital-to-analog converter 150. More specifically, the second waveform data outputting unit 1200-2 in the calibration waveform data outputting unit 1200 outputs second waveform data 2030 for calibration at each sampling time timing τ (t=τ1, τ2, τ3, . . . ) (index value 2010) illustrated in FIG. 6.

$$s_{cal-b}(\tau) = b\tau \tag{8}$$

The pre-equalized waveform generation device 1000 executes compression waveform data acquisition processing (step ST20).

Specifically, the compression waveform data acquiring unit 1400 in the pre-equalized waveform generation device 1000 acquires compression waveform data that is a waveform compressed via the compression transmission path 200.

More specifically, the first compression waveform data acquiring unit 1400-1 in the compression waveform data acquiring unit 1400 acquires first compression waveform data 2120 at each sampling time timing T (T=T1, T2, T3, . . . ) (index value 2110) illustrated in FIG. 6.

In addition, the second compression waveform data acquiring unit 1400-2 in the compression waveform data acquiring unit 1400 acquires second compression waveform data 2130 at each sampling time timing T (T=T1, T2, T3, . . . ) (index value 2110) illustrated in FIG. 6.

The pre-equalized waveform generation device 1000 determines whether the acquisition of the compression waveform data based on the calibration waveform data has ended (step ST30).

Specifically, for example, when all the calibration waveform data is output from the calibration waveform data outputting unit 1200 and all the compression waveform data is acquired by the compression waveform data acquiring unit 1400, a control unit (not illustrated) of the pre-equalized waveform generation device 1000 determines that the acquisition of the compression waveform data based on the calibration waveform data has ended.

The pre-equalized waveform generation device 1000 repeats the processing from step ST10 until it is determined that the acquisition of the compression waveform data based on the waveform data for calibration has ended.

The pre-equalized waveform generation device 1000 executes compression characteristic estimation processing (step ST40) (corresponding to "2200" and "2300" illustrated in FIG. 6).

Specifically, the compression characteristic estimating unit 1500 in the pre-equalized waveform generation device 1000 estimates a compression characteristic using the compression waveform data acquired by the compression waveform data acquiring unit 1400.

More specifically, the compression characteristic estimating unit 1500 calculates a compression function differential value g'(T) (Expression (9), "2210" shown in FIG. 6) for each sampling time timing value T (T=T1, T2, T3, . . . ) (index value 2110 illustrated in FIG. 6) by using the first compression waveform data Acal-a(T) (T=T1, T2, T3, . . . ) ("2120" illustrated in FIG. 6) ("2200" illustrated in FIG. 6). The compression characteristic estimating unit 1500 performs upsampling processing on the compression function differential value g'(T) to interpolate data between the sampling time timings T ("2300" illustrated in FIG. 6). The compression characteristic estimating unit 1500 outputs an upsampled compression function differential value g'(t) (t=t1, t2, t3, . . . ) (Expression (10), "2320" illustrated in FIG. 6).

$$g'(T) = \frac{A_{cal-a}(T)}{a} \tag{9}$$

$$g'(t) = \frac{A_{cal-a}(t)}{a} \tag{10}$$

In addition, the compression characteristic estimating unit 1500 calculates a compression function value g(T) (T=T1, T2, T3, . . . ) (Expression (11), "2220" illustrated in FIG. 6) at each sampling time timing T ("2110" illustrated in FIG. 6) by using the compression function differential value g'(T) (T=T1, T2, T3, . . . ) ("2210" illustrated in FIG. 6) and the second compression waveform data Acal-b(T) (T=T1, T2, T3, . . . ) ("2130" illustrated in FIG. 6) ("2200" illustrated in FIG. 6). The compression characteristic estimating unit 1500 performs upsampling processing on the compression function value g(T) to interpolate data between the sampling time timings T ("2300" illustrated in FIG. 6). The compression characteristic estimating unit 1500 outputs an upsampled compression function value g(t) (t=t1, t2, t3, . . . ) (Expression (12), "2330" illustrated in FIG. 6).

$$g(T) = \frac{A_{cal-b}(T)}{g'(T)b} = \frac{a}{b}\frac{A_{cal-b}(T)}{A_{cal-a}(T)} \tag{11}$$

$$g(t) = \frac{A_{cal-b}(t)}{g'(t)b} = \frac{a}{b}\frac{A_{cal-b}(t)}{A_{cal-a}(t)} \tag{12}$$

Using the sampling time timing value τ (τ=τ1, τ2, τ3, . . . ) and the compression function value g(t), the compression characteristic estimating unit 1500 extracts a sampling time timing value tk in such a manner that sampling time timing value τk (k=1, 2, 3, . . . )=compression function value g(tk) (index value).

The pre-equalized waveform generation device 1000 executes pre-equalization calculation processing (step ST50).

Specifically, the pre-equalization calculation unit 1800 in the pre-equalized waveform generation device 1000 calculates pre-equalized waveform data by using the signal waveform and the compression characteristic.

More specifically, using the ideal compression waveform data (Aideal(t)) acquired by the ideal compression waveform acquiring unit 1700, the compression characteristic (the compression function differential value g'(t) (t=t1, t2, t3, . . . ), and the corresponding time information obtained by combining the sampling time timing value τk (k=1, 2, 3, . . . ) and the sampling time timing value tk) estimated by the compression characteristic estimating unit 1500, the pre-equalization calculation unit 1800 divides the ideal compression waveform data Aideal(tk) by the compression function differential value g'(tk), and calculates pre-equalized waveform data scal(τk) (Expression (13), "2610" illustrated in FIG. 6) for each sampling time timing value τk ("2620" illustrated in FIG. 6) ("2600" illustrated in FIG. 6).

$$s_{cal}(\tau_k) = \frac{A_{ideal}(t_k)}{g'(t_k)} \tag{13}$$

Next, when executing the processing of step ST50, the pre-equalized waveform generation device 1000 outputs the pre-equalized waveform data and ends the processing.

Specifically, when the processing of step ST50 is executed, the switching control unit 1300 in the pre-equalized waveform generation device 1000 performs switching in such a manner as to output the pre-equalized waveform data calculated by the pre-equalization calculation unit 1800.

Note that, in a case of a configuration not including the switching control unit 1300, the pre-equalization calculation unit 1800 may directly output the pre-equalized waveform data to the DA converter.

Here, a specific example of processing order of the calibration waveform data output processing and the compression waveform data acquisition processing will be described. Here, an example in which two calibration waveform data are output and two compression waveform data are acquired will be described.

Figure 8:
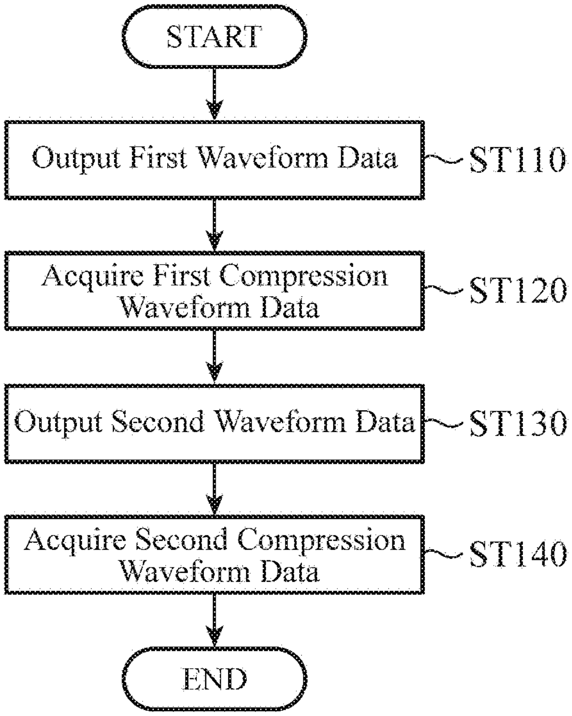
FIG. 8 is a flowchart illustrating a specific example of calibration waveform data output processing and compression waveform data acquisition processing illustrated in FIG. 7.

FIG. 8 is a flowchart illustrating a specific example of the calibration waveform data output processing and the compression waveform data acquisition processing illustrated in FIG. 7.

For example, when the waveform compression device 100 is activated, the pre-equalized waveform generation device 1000 starts the processing illustrated in FIG. 8.

The pre-equalized waveform generation device 1000 outputs first waveform data for calibration (step ST110).

Specifically, the first waveform data outputting unit 1200-1 in the calibration waveform data outputting unit 1200 of the pre-equalized waveform generation device 1000 outputs the first waveform data for calibration.

Next, the pre-equalized waveform generation device 1000 acquires first compression waveform data (step ST120).

Specifically, the first compression waveform data acquiring unit 1400-1 in the compression waveform data acquiring unit 1400 of the pre-equalized waveform generation device 1000 starts standby when processing of step ST110 is started, and acquires the first compression waveform data by the first compression waveform data being output by the analog-to-digital converter 190.

Next, the pre-equalized waveform generation device 1000 outputs second waveform data for calibration (step ST130).

Specifically, when the first compression waveform data is acquired by the first compression waveform data acquiring unit 1400-1, the second waveform data outputting unit 1200-2 in the calibration waveform data outputting unit 1200 of the pre-equalized waveform generation device 1000 outputs the second waveform data for calibration.

Next, the pre-equalized waveform generation device 1000 acquires second compression waveform data (step ST140).

Specifically, the second compression waveform data acquiring unit 1400-2 in the compression waveform data acquiring unit 1400 of the pre-equalized waveform generation device 1000 starts standby when processing of step ST130 is started, and acquires the second compression waveform data by the second compression waveform data being output by the analog-to-digital converter 190.

Next, the pre-equalized waveform generation device 1000 ends the processing illustrated in FIG. 8 and proceeds to the compression characteristic estimation processing.

Figure 9A:
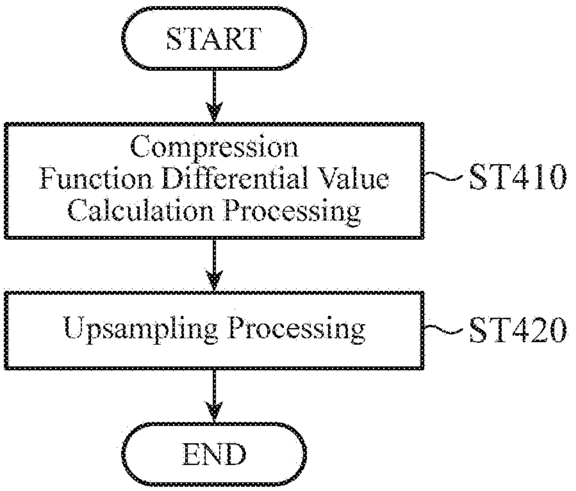
FIG. 9A is a flowchart illustrating a specific example of first processing in compression characteristic estimation processing illustrated in FIG. 7.
Figure 9B:
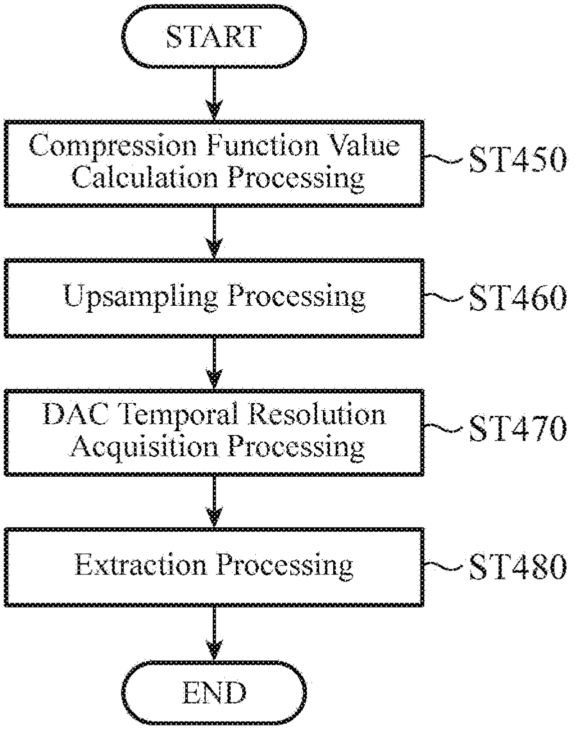
FIG. 9B is a flowchart illustrating a specific example of second processing in the compression characteristic estimation processing illustrated in FIG. 7.

FIG. 9A is a flowchart illustrating a specific example of first processing in the compression characteristic estimation processing illustrated in FIG. 7. FIG. 9B is a flowchart illustrating a specific example of second processing in the compression characteristic estimation processing illustrated in FIG. 7.

When starting the compression characteristic estimation processing illustrated in FIG. 7, the pre-equalized waveform generation device 1000 executes the processing illustrated in FIG. 9A, for example.

The compression characteristic estimating unit 1500 in the pre-equalized waveform generation device 1000 executes compression function differential value calculation processing (step ST410).

Specifically, the compression function differential value calculating unit 1510 in the compression characteristic estimating unit 1500 calculates the compression function differential value g'(T) (T=T1, T2, T3, . . . ) (Equation (9), "2210" shown in FIG. 6) for each sampling time timing value T (T=T1, T2, T3, . . . ) (index value 2110 illustrated in FIG. 6) by using the first compression waveform data Acal-a(T) (T=T1, T2, T3, . . . ) ("2120" illustrated in FIG. 6) acquired from the first compression waveform data acquiring unit 1400-1 ("2200" illustrated in FIG. 6).

Next, the compression characteristic estimating unit 1500 executes upsampling processing (step ST420).

Specifically, the upsampling processing unit 1530 in the compression characteristic estimating unit 1500 performs upsampling processing in such a manner that the number of samples (the number sampled for each sampling time timing value T (T=T1, T2, T3, . . . )) of the compression function differential value g'(T) (T=T1, T2, T3, . . . ) is increased to m times (m>1) to interpolate data between the sampling time timings T ("2300" illustrated in FIG. 6). The upsampling processing can be implemented by processing using linear interpolation, for example. The upsampling processing unit 1530 outputs the upsampled compression function differential value g'(t) (t=t1, t2, t3, . . . ) (Expression (10), "2320" illustrated in FIG. 6).

After executing processing of step ST420, the compression characteristic estimating unit 1500 ends the processing illustrated in FIG. 9A and starts the processing illustrated in FIG. 9B.

The compression characteristic estimating unit 1500 in the pre-equalized waveform generation device 1000 executes compression function value calculation processing (step ST450).

Specifically, the compression function value calculating unit 1520 in the compression characteristic estimating unit 1500 calculates the compression function value g(T) (T=T1, T2, T3, . . . ) (Expression (11), "2220" in FIG. 6) for each sampling time timing value T (T=T1, T2, T3, . . . ) (index value 2110 illustrated in FIG. 6) by using the compression function differential value g'(T) (T=T1, T2, T3, . . . ) ("2210" illustrated in FIG. 6) and the second compression waveform data Acal-b(T) (T=T1, T2, T3, . . . ) ("2130" in FIG. 6) acquired from the second compression waveform data acquiring unit 1400-2 ("2200" illustrated in FIG. 6).

Next, the compression characteristic estimating unit 1500 executes upsampling processing (step ST460).

Specifically, the upsampling processing unit 1540 in the compression characteristic estimating unit 1500 performs upsampling processing in such a manner that the number of samples (the number sampled for each sampling time timing value T (T=T1, T2, T3, . . . )) of the compression function value g(T) is increased to m times (m is any natural number) to interpolate data between the sampling time timings T ("2300" illustrated in FIG. 6). The upsampling processing can be implemented by processing using linear interpolation, for example. The upsampling processing unit 1530 outputs the upsampled compression function value g(t) (t=t1, t2, t3, . . . ) (Expression (12), "2330" illustrated in FIG. 6).

Next, the compression characteristic estimating unit 1500 executes DAC temporal resolution acquisition processing (step ST470).

Specifically, the DAC temporal resolution acquiring unit 1550 in the compression characteristic estimating unit 1500 acquires a sampling rate (sampling frequency) fmon of the digital-to-analog converter 150, and calculates a temporal resolution 1/fmon (=t). The DAC temporal resolution acquiring unit 1550 acquires a sampling time timing value τ (τ=τ1, τ2, τ3, . . . ) ("2410" illustrated in FIG. 6) using a calculation result.

Next, the compression characteristic estimating unit 1500 executes extraction processing (step ST480).

Specifically, the extraction unit 1560 in the compression characteristic estimating unit 1500 extracts a sampling time timing value tk (index value) in which sampling time timing value τk (k=1, 2, 3, . . . )=compression function value g(tk) ("2500" illustrated in FIG. 6). As a result, the sampling time timing value tk corresponding to each sampling time timing value τk (k=1, 2, 3, . . . ) is extracted.

When executing processing of step ST480, the pre-equalized waveform generation device 1000 ends the processing illustrated in FIG. 9B and proceeds to the pre-equalization calculation processing illustrated in FIG. 7.

Here, processing of generating an ideal compression waveform used in the pre-equalization calculation processing will be described. This processing is processing in a case where the pre-equalized waveform generation device 1000 has a configuration for generating an ideal compression waveform (for example, the configuration illustrated in FIG. 4).

Figure 10:
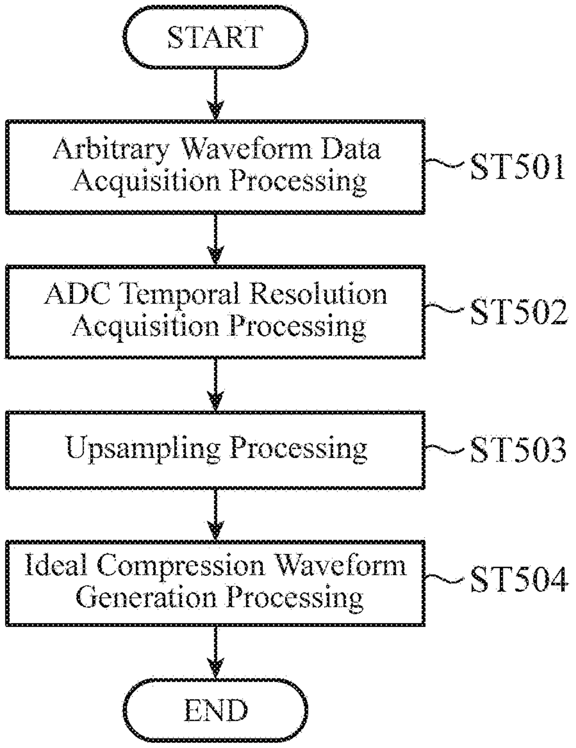
FIG. 10 is a flowchart illustrating a specific example of processing of generating an ideal compression waveform in pre-equalization calculation processing illustrated in FIG. 7.

FIG. 10 is a flowchart illustrating a specific example of processing of generating an ideal compression waveform used in the pre-equalization calculation processing illustrated in FIG. 7.

Timing at which the pre-equalized waveform generation device 1000 executes the processing illustrated in FIG. 10 may be any timing as long as it is executed before executing the pre-equalization calculation processing.

The ideal compression waveform acquiring unit 1700 in the pre-equalized waveform generation device 1000 executes arbitrary waveform data acquisition processing (step ST501).

Specifically, the arbitrary waveform data acquiring unit 1710 in the ideal compression waveform acquiring unit 1700 acquires signal waveform data by receiving waveform data from the outside of the pre-equalized waveform generation device 1000, for example.

The ideal compression waveform acquiring unit 1700 in the pre-equalized waveform generation device 1000 executes ADC temporal resolution acquisition processing (step ST502).

Specifically, the ADC temporal resolution acquiring unit 1720 in the ideal compression waveform acquiring unit 1700 acquires a sampling rate (sampling frequency) fdac of the analog-to-digital converter 190, and calculates a temporal resolution 1/fdac (=T). The ADC temporal resolution acquiring unit 1720 acquires each sampling time timing value T (T=T1, T2, T3, . . . ) by using a calculation result.

The ideal compression waveform acquiring unit 1700 in the pre-equalized waveform generation device 1000 executes upsampling processing (step ST503).

Specifically, the upsampling processing unit 1730 in the ideal compression waveform acquiring unit 1700 executes upsampling processing of multiplying the number of samplings by m by using the sampling time timing T acquired by the ADC temporal resolution acquiring unit 1720. The upsampling processing unit 1730 determines a sampling time timing value t (t=t1, t2, t3, . . . ) (index value) by performing linear interpolation, for example.

The pre-equalized waveform generation device 1000 executes ideal compression waveform generation processing (step ST504).

Specifically, the ideal compression waveform generating unit 1740 in the pre-equalized waveform generation device 1000 generates ideal compression waveform data by using the signal waveform data and the sampling time timing value t (t=t1, t2, t3, . . . ) acquired by the ideal compression waveform acquiring unit 1700.

More specifically, the ideal compression waveform generating unit 1740 performs resampling processing on the signal waveform data by using the sampling time timing value t (t=t1, t2, t3, . . . ) to generate ideal compression waveform data Aideal(t) (t=t1, t2, t3, . . . ).

Here, a case where the signal waveform data is uncompressed waveform data and a case where the signal waveform data is compressed waveform data will be described.

In a case where the signal waveform data is uncompressed waveform data s(τ) (τ=τ1, τ2, τ3, . . . ) that has not been compressed, the ideal compression waveform generating unit 1740 assumes the linear compression g(t)=Rt by using the above-described Expression (1), resamples the signal waveform data s(τ) (τ=τ1, τ2, τ3, . . . ) on the basis of the sampling time "t", and generates resampled signal waveform data s (R×t) (t=t1, t2, t3, . . . ). The ideal compression waveform generating unit 1740 calculates ideal compression waveform data (Aideal(t)=s(R×t)×R) (t=t1, t2, t3, . . . ) by using each value of the signal waveform data s (R×t) (t=t1, t2, t3, . . . ).

In a case where the signal waveform data is the compressed waveform data A(T)(T=T1, T2, T3, . . . ) that has already been compressed, the ideal compression waveform generating unit 1740 resamples the compressed waveform data A(T)(T=T1, T2, T3, . . . ) by using the sampling time "t". The ideal compression waveform generating unit 1740 performs upsampling processing (for example, upsampling processing by linear interpolation) in a case where a sampling rate based on the sampling time "T" of the compression waveform data is lower than the sampling rate based on the time "t", and performs downsampling processing (for example, downsampling processing by thinning data) in a case where the sampling rate based on the sampling time "T" of the compression waveform data is higher than the sampling rate based on the time "t". The ideal compression waveform generating unit 1740 calculates the ideal compression waveform data (Aideal(t)) (t=t1, t2, t3, . . . ).

When the pre-equalized waveform generation device 1000 ends the processing of step ST504, the ideal compression waveform generating unit 1740 outputs the ideal compression waveform data Aideal(t) (t=t1, t2, t3, . . . ) to the pre-equalization calculation unit 1800, and ends the processing illustrated in FIG. 10.

Figure 11:
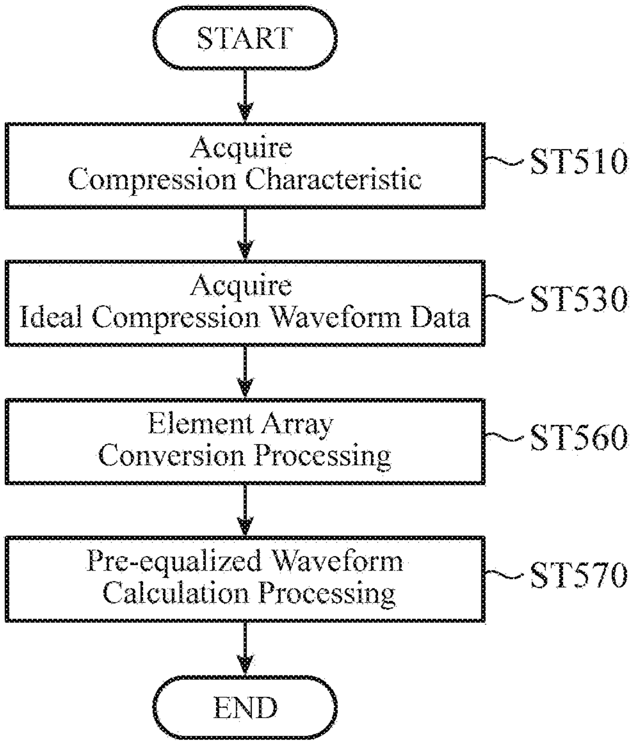
FIG. 11 is a flowchart illustrating a specific example of processing of calculating pre-equalized waveform data in the pre-equalization calculation processing illustrated in FIG. 7.

FIG. 11 is a flowchart illustrating a specific example of processing of calculating pre-equalized waveform data in the pre-equalization calculation processing illustrated in FIG. 7.

When starting the pre-equalization calculation processing illustrated in FIG. 7, the pre-equalized waveform generation device 1000 executes the processing illustrated in FIG. 11, for example.

The pre-equalization calculation unit 1800 in the pre-equalized waveform generation device 1000 executes compression characteristic acquisition processing (step ST510).

Specifically, the element array converting unit 1880 in the pre-equalization calculation unit 1800 acquires the compression characteristic estimated by the compression characteristic estimating unit 1500 from the compression characteristic storing unit 1600. The compression characteristic is information including the compression function differential value g'(t) and a combination of the sampling time timing value "τk" (k=1, 2, 3, . . . ) and the sampling time timing value "tk" (k=1, 2, 3, . . . ), which have been output from the compression characteristic estimating unit 1500.

The pre-equalization calculation unit 1800 in the pre-equalized waveform generation device 1000 executes ideal compression waveform data acquisition processing (step ST530).

Specifically, the element array converting unit 1880 in the pre-equalization calculation unit 1800 acquires the ideal compression waveform data Aideal(t) (t=t1, t2, t3, . . . ) from the ideal compression waveform acquiring unit 1700.

Next, the pre-equalization calculation unit 1800 in the pre-equalized waveform generation device 1000 executes element array conversion processing (step ST560).

Specifically, the element array converting unit 1880 in the pre-equalization calculation unit 1800 changes a correspondence relationship between data in such a manner as to associate the sampling time timing value (index value) τk (k=1, 2, 3, . . . ) of the waveform data output to the digital-to-analog converter 150, the ideal compression waveform data Aideal(tk), and the compression function differential value g'(tk) in the order of k. ("2500" and "2600" illustrated in FIG. 6)

Next, the pre-equalization calculation unit 1800 in the pre-equalized waveform generation device 1000 executes pre-equalized waveform calculation processing (step ST570).

Specifically, the pre-equalized waveform data calculating unit 1890 in the pre-equalization calculation unit 1800 calculates the pre-equalized waveform data scal(τk) (k=1, 2, 3, . . . ) by using the ideal compression waveform data Aideal(t) (t=t1, t2, t3, . . . ) and the compression characteristic (information including the compression function differential value "g'(t)" (t=t1, t2, t3, . . . ), the sampling time timing value "τk" (k=1, 2, 3, . . . ), and the sampling time timing value "tk").

More specifically, the pre-equalized waveform data calculating unit 1890 calculates the pre-equalized waveform data scal(τk) for each sampling time timing τk (k=1, 2, 3, . . . ) by dividing the ideal compression waveform data Aideal(tk) by the compression function differential value g'(tk) using the ideal compression waveform data Aideal(tk) and the compression function differential value g'(tk) for each sampling time timing value tk. The pre-equalized waveform data calculating unit 1890 outputs the pre-equalized waveform data scal(τk) (k=1, 2, 3, . . . ) to the digital-to-analog converter 150 via the switching control unit 1300.

When ending the processing of step ST570, the pre-equalized waveform generation device 1000 ends the processing illustrated in FIG. 11.

Here, a simulation result of pre-equalization in a case where the nonlinear compression characteristic of the compression transmission path is a quadratic function type will be described.

Figure 12:
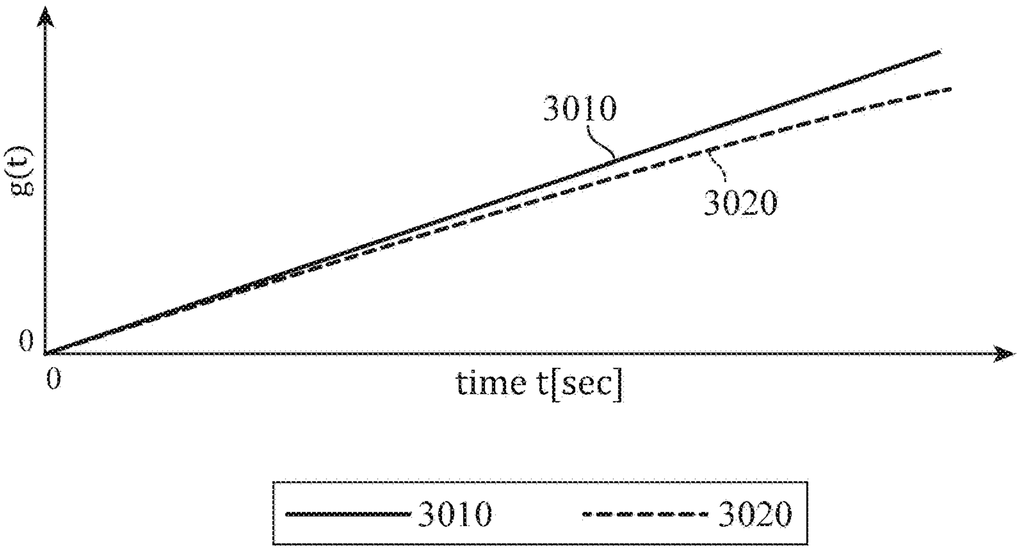
FIG. 12 is a diagram for explaining an example of nonlinear compression.

FIG. 12 is a diagram for explaining an example of nonlinear compression.

In a case where the compression function is represented by a linear function as in a compression function 3010 illustrated in FIG. 12 in ideal linear compression, a difference of a compression function 3020 in a case of the nonlinear compression increases as time elapses with respect to the compression function 3010.

Figure 13A:
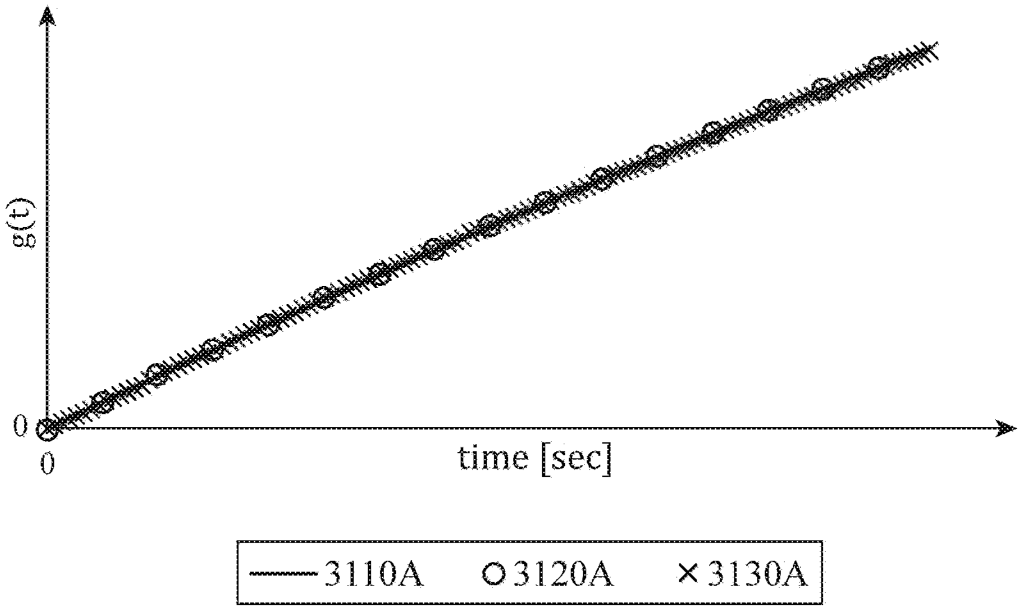
FIG. 13A is a diagram illustrating an example of an estimation result of a compression function value.
Figure 13B:
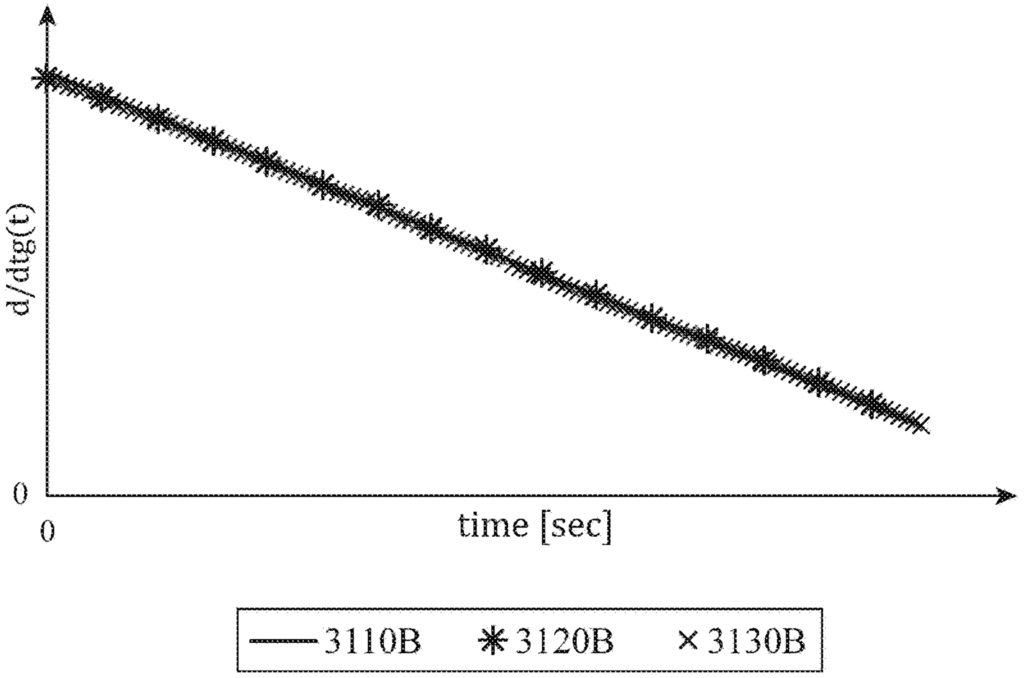
FIG. 13B is a diagram illustrating an example of an estimation result of a differential value of a compression function.

FIG. 13A is a diagram illustrating an example of an estimation result of a compression function value. FIG. 13B is a diagram illustrating an example of an estimation result of a differential value of a compression function.

When the compression function is estimated using the first waveform data for calibration by the method of the present disclosure, an actual compression function value 3110A, an estimated compression function value 3120A, and a compression function value 3130 A further estimated by linear interpolation are in a substantially matched state as illustrated in FIG. 13A.

Figure 14:
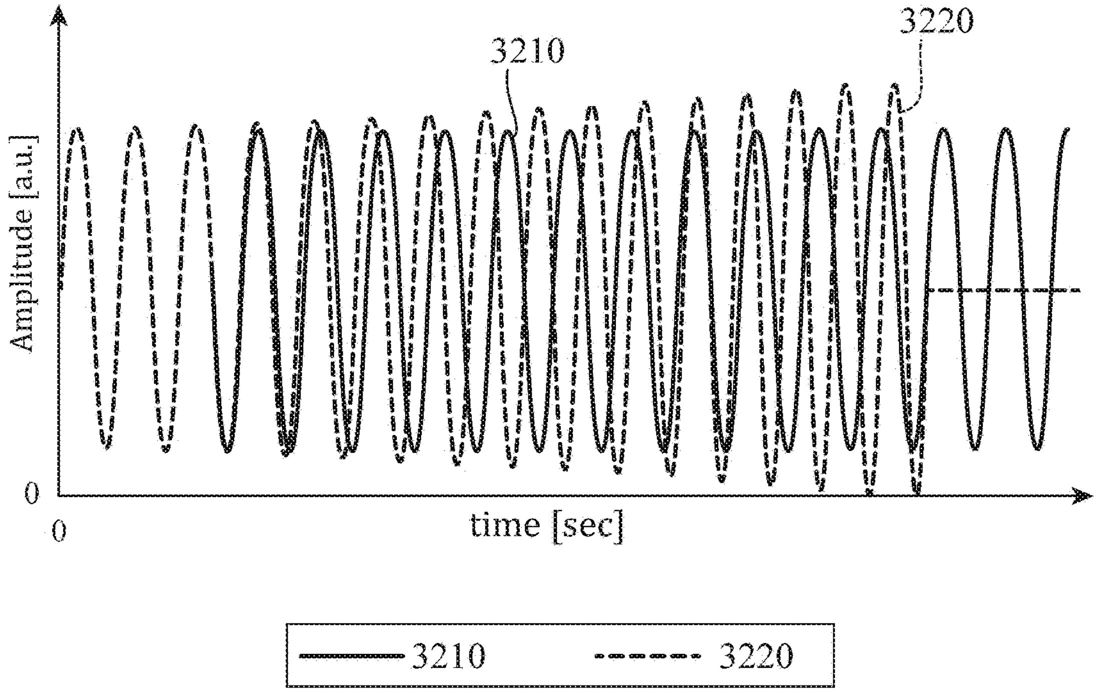
FIG. 14 is a first diagram for explaining a difference depending on the presence or absence of pre-equalization according to the present disclosure.

In addition, when the compression function differential is further estimated using the second waveform data by the method of the present disclosure, an actual compression function differential value 3110B, an estimated compression function differential value 3120B, and a compression function value 3130B further estimated by linear interpolation are in a substantially matched state as illustrated in FIG. 13B. FIG. 14 is a first diagram for explaining a difference depending on the presence or absence of pre-equalization according to the present disclosure.

FIG. 14 illustrates a compression transmission path input waveform 3220 in a case where pre-equalization has been performed using the estimation results of the compression function and the compression function differential as described above, and a compression transmission path input waveform 3210 in a case where pre-equalization is not performed.

In the compression transmission path input waveform 3220, a waveform is more compressed and an amplitude value is larger as time passes than those of the compression transmission path input waveform 3210.

Figure 15:
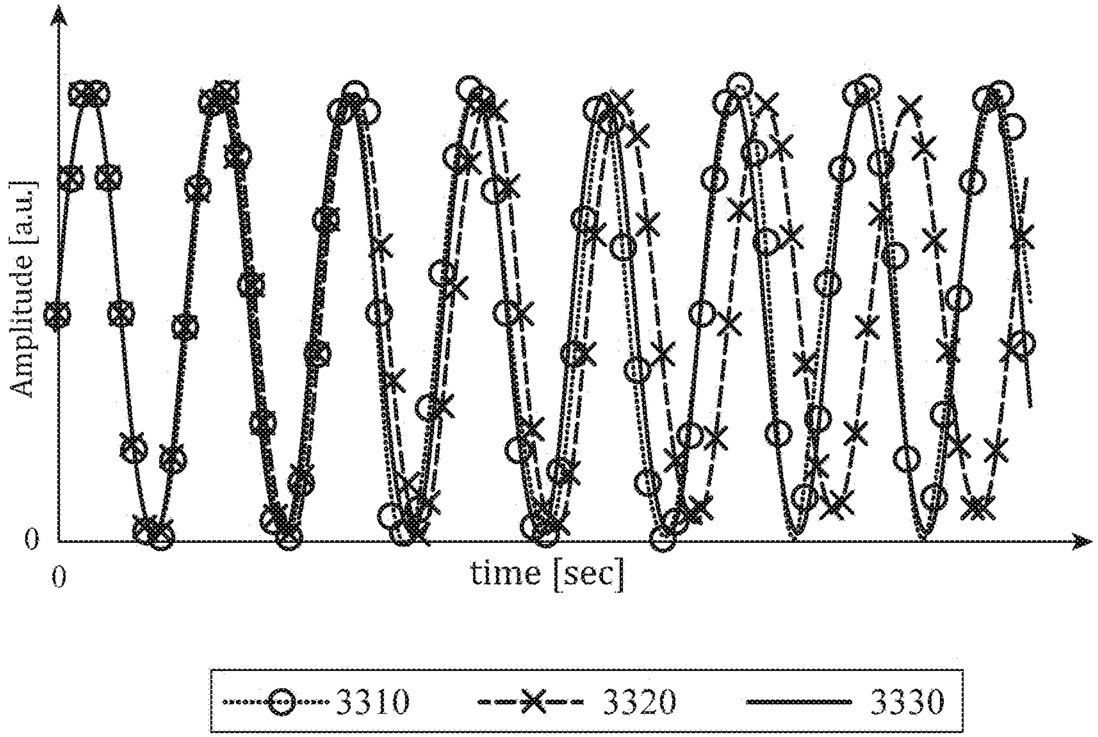
FIG. 15 is a second diagram for explaining a difference depending on the presence or absence of the pre-equalization according to the present disclosure.

FIG. 15 is a second diagram for explaining a difference depending on the presence or absence of the pre-equalization according to the present disclosure. FIG. 15 illustrates a compression transmission path output waveform 3310 in a case where there is pre-equalization, a compression transmission path output waveform 3320 in a case where there is no pre-equalization, and an ideal compression waveform 3330.

As illustrated in FIG. 15, it can be seen that the compression transmission path output waveform 3310 substantially coincides with the ideal compression waveform 3330, whereas the compression transmission path output waveform 3320 deviates from the ideal compression waveform 3330 and distortion occurs.

As described above, according to the present disclosure, by estimating the compression characteristic of the compression transmission path and generating the pre-equalized waveform data of any signal waveform data using the compression characteristic, it is possible to suppress an influence of the nonlinear compression characteristic of the compression transmission path.

A modification of the pre-equalized waveform generation device 1000 illustrated in FIG. 1 will be described.

Figure 16:
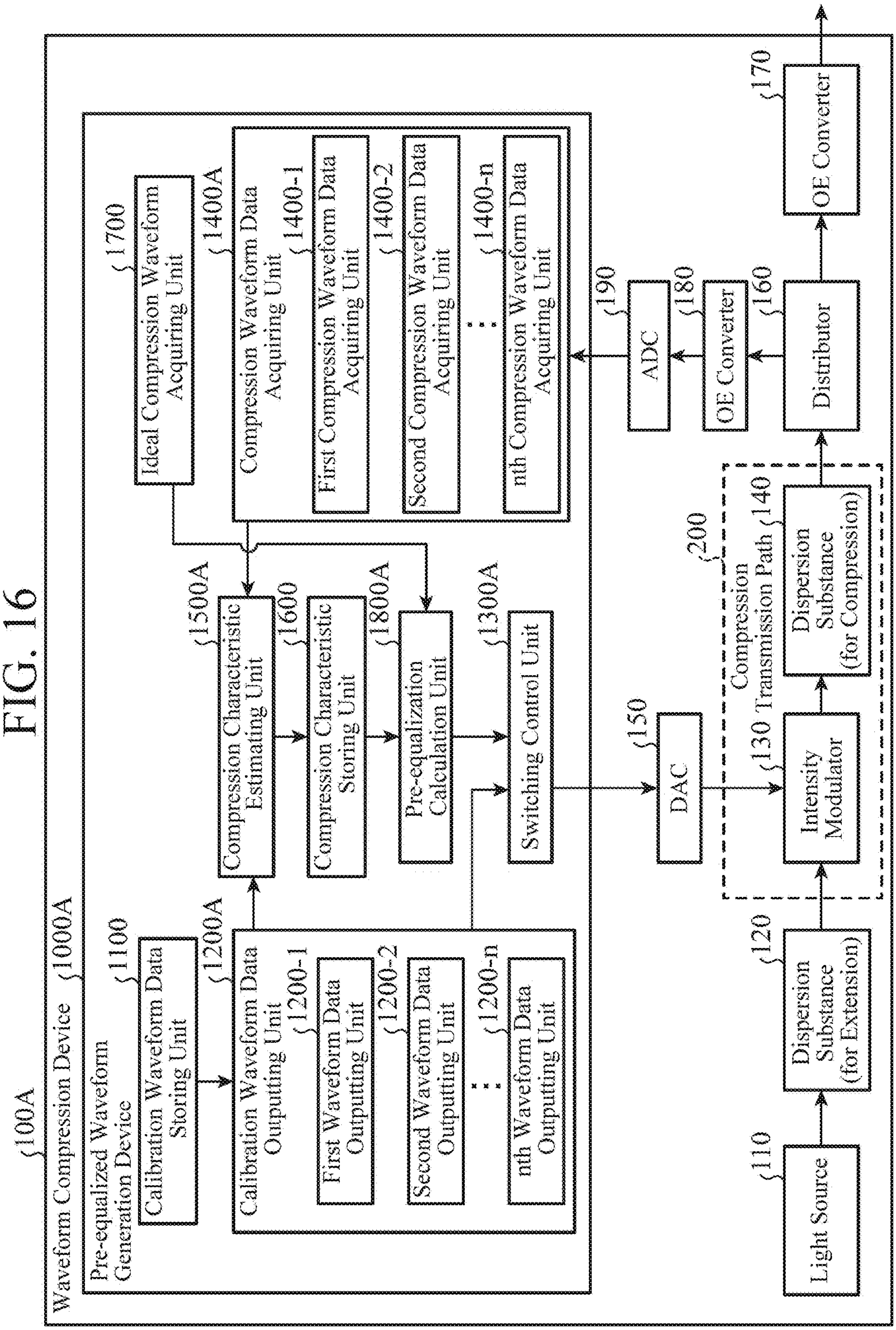
FIG. 16 is a diagram illustrating a first modification of a configuration of a waveform compression device including a pre-equalized waveform generation device according to the first embodiment of the present disclosure.

FIG. 16 is a diagram illustrating a first modification of a configuration of a waveform compression device 100A including a pre-equalized waveform generation device 1000A according to the first embodiment of the present disclosure.

The waveform compression device 100A includes a light source 110, a dispersion substance (dispersion substance for extension) 120, an intensity modulator 130, a dispersion substance (dispersion substance for compression) 140, a digital-to-analog converter (DAC) 150, a distributor 160, an OE converter (first OE converter) 170, an OE converter (second OE converter) 180, an analog-to-digital converter (ADC) 190, and the pre-equalized waveform generation device 1000A.

The light source 110, the dispersion substance (dispersion substance for extension) 120, the intensity modulator 130, the dispersion substance (dispersion substance for compression) 140, the digital-to-analog converter (DAC) 150, the distributor 160, the OE converter (first OE converter) 170, the OE converter (second OE converter) 180, and the analog-to-digital converter (ADC) 190 in FIG. 16 have configurations similar to those illustrated in FIG. 1, and thus, a detailed description thereof is omitted here.

The pre-equalized waveform generation device 1000A includes a calibration waveform data storing unit 1100, a calibration waveform data outputting unit 1200 A, a switching control unit 1300A, a compression waveform data acquiring unit 1400A, a compression characteristic estimating unit 1500A, a compression characteristic storing unit 1600, an ideal compression waveform acquiring unit 1700, and a pre-equalization calculation unit 1800A.

The calibration waveform data outputting unit 1200A outputs three or more waveform data including first waveform data and second waveform data at different timings.

The calibration waveform data outputting unit 1200A illustrated in FIG. 16 includes a first waveform data outputting unit 1200-1, a second waveform data outputting unit 1200-2, . . . , and an nth waveform data outputting unit **1200-*n*** (n≥3).

Some examples of a combination of waveforms used for waveform data for calibration in a case of this configuration will be described.

(First Example)

A waveform of the first waveform data is a waveform represented by a constant function.

A waveform of the second waveform data is a waveform expressed by a linear function.

A waveform of the third waveform data is a waveform represented by a constant function different from the constant function representing the waveform of the first waveform data.

(Second Example)

A waveform of the first waveform data is a waveform represented by a constant function.

A waveform of the second waveform data is a waveform expressed by a linear function.

A waveform of the third waveform data is a waveform represented by a linear function different from the linear function representing the waveform of the second waveform data.

(Third Example)

An expression representing the first waveform data and an expression representing the second waveform data are different from each other in the order of a time variable.

The third waveform data is the same waveform data as the first waveform data or the second waveform data.

(Fourth Example)

An expression representing the first waveform data and an expression representing the second waveform data are different from each other in the order of a time variable.

A waveform of at least one waveform data of the three or more waveform data including the first waveform data and the second waveform data is a waveform represented by a function having a second or higher order.

For example, the switching control unit 1300A illustrated in FIG. 16 causes the first waveform data outputting unit 1200-1 of the calibration waveform data outputting unit 1200A to output the first waveform data, the second waveform data outputting unit 1200-2 of the calibration waveform data outputting unit 1200A to output the second waveform data, and then, the nth waveform data outputting unit **1200-*n* of the calibration waveform data outputting unit 1200A to further output nth waveform data. After all the waveform data is output from the calibration waveform data outputting unit 1200A, the switching control unit 1300A performs switching in such a manner as to cause the pre-equalization calculation unit 1800**A to output the pre-equalized waveform data.

The compression waveform data acquiring unit 1400A acquires three or more compression waveform data including first compression waveform data and second compression waveform data at different timings.

The compression waveform data acquiring unit 1400A illustrated in FIG. 16 includes a first compression waveform data acquiring unit 1400-1, a second compression waveform data acquiring unit 1400-2, . . . , and an nth compression waveform data acquiring unit **1400-*n*** (n≥3).

The compression waveform data acquiring unit 1400A further acquires nth compression waveform data indicating a waveform modulated using the nth waveform data and compressed via a compression transmission path.

When the number of pieces of calibration waveform data described above is three, the compression waveform data acquiring unit 1400A further acquires third compression waveform data indicating a waveform modulated using the third waveform data and compressed via the compression transmission path, in addition to the first compression waveform data and the second compression waveform data.

The compression characteristic estimating unit 1500A illustrated in FIG. 16 estimates a compression characteristic by using three or more compression waveform data including the first compression waveform data and the second compression waveform data.

In a case where the number of compression waveform data described above is three, the compression characteristic estimating unit 1500A estimates a compression characteristic that is a characteristic of the compression transmission path by using the first compression waveform data, the second compression waveform data, and the third compression waveform data.

Since the compression characteristic storing unit 1600 has a function similar to that of the compression characteristic storing unit 1600 described above, a detailed description thereof is omitted here.

Since the ideal compression waveform acquiring unit 1700 has a function similar to that of the ideal compression waveform acquiring unit 1700 described above, a detailed description thereof is omitted here.

The pre-equalization calculation unit 1800A has a function of calculating pre-equalized waveform data.

The pre-equalization calculation unit 1800A calculates pre-equalized waveform data by using a signal waveform input from the outside of the device and the compression characteristic estimated by the compression characteristic estimating unit 1500A.

The pre-equalization calculation unit 1800A illustrated in FIG. 16 calculates the pre-equalized waveform data by acquiring and using the compression characteristic from the compression characteristic storing unit 1600.

Calibration waveform data output processing and compression waveform data acquisition processing in the pre-equalized waveform generation device 1000A will be described.

Figure 17:
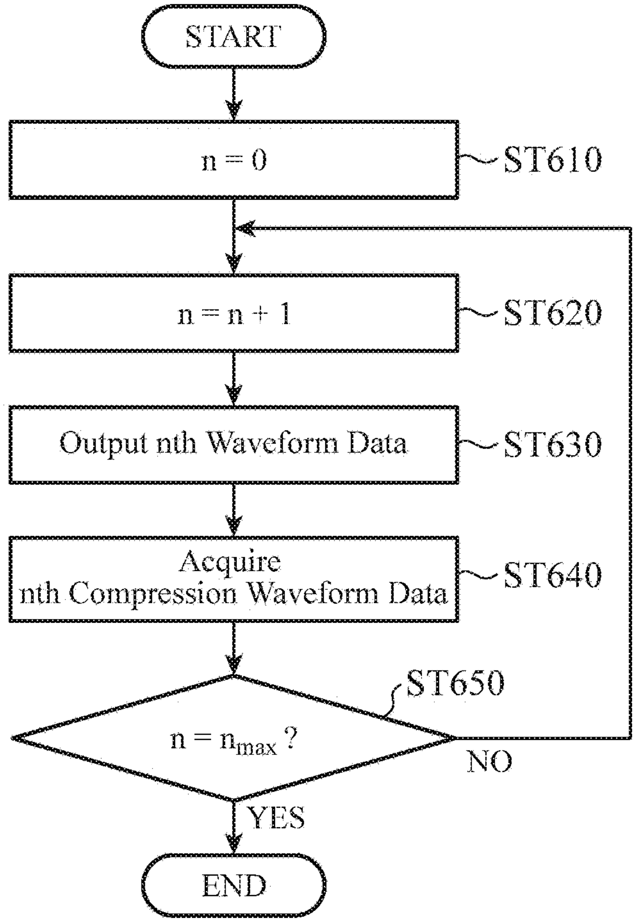
FIG. 17 is a flowchart illustrating a specific example of calibration waveform data output processing and compression waveform data acquisition processing in the pre-equalized waveform generation device illustrated in FIG. 16.

FIG. 17 is a flowchart illustrating a specific example of the calibration waveform data output processing and the compression waveform data acquisition processing in the pre-equalized waveform generation device 1000A illustrated in FIG. 16.

For example, when the waveform compression device 100A is activated, the pre-equalized waveform generation device 1000A starts the processing illustrated in FIG. 17.

The pre-equalized waveform generation device 1000A resets a value “n” to 0 (n=0) (step ST610).

Specifically, the calibration waveform data outputting unit in the pre-equalized waveform generation device 1000A resets the value “n” indicating a number of the waveform data outputting unit to 0 (n=0).

The pre-equalized waveform generation device 1000A increments the value “n” (n=n+1) (step ST620).

Specifically, the calibration waveform data outputting unit 1200A in the pre-equalized waveform generation device 1000A increments the value “n” (n=n+1).

The pre-equalized waveform generation device 1000A outputs nth waveform data (step ST630).

Specifically, the nth waveform data outputting unit **1200-*n* in the calibration waveform data outputting unit 1200A of the pre-equalized waveform generation device 1000A refers to the calibration waveform data storing unit 1100** and outputs the nth waveform data.

The pre-equalized waveform generation device 1000A acquires nth compression waveform data (step ST640).

Specifically, the nth compression waveform data acquiring unit **1400-*n* in the compression waveform data acquiring unit 1400A of the pre-equalized waveform generation device 1000**A acquires the nth compression waveform data.

The pre-equalized waveform generation device 1000A determines whether the value n has reached a maximum value nmax (n=nmax) (step ST650).

Specifically, the calibration waveform data outputting unit in the pre-equalized waveform generation device 1000A determines whether the value n has reached the maximum value nmax (n=nmax).

In a case where the value n has not reached the maximum value nmax (step ST650 “NO”), the pre-equalized waveform generation device 1000A proceeds to processing of step ST620 and repeats the processing from the processing of step ST620.

In a case where the value “n” has reached the maximum value “nmax” (n=nmax) (step ST650 “YES”), the pre-equalized waveform generation device 1000A ends the processing illustrated in FIG. 17.

With the configuration of the first modification, the pre-equalized waveform generation device 1000A can accurately estimate the compression characteristic of the compression transmission path, and can generate a pre-equalized waveform with high accuracy in such a manner that distortion of the compression waveform due to the nonlinear compression characteristic of the compression transmission path 200 is further reduced.

A second modification of the waveform compression device illustrated in FIG. 1 will be described.

Figure 18:
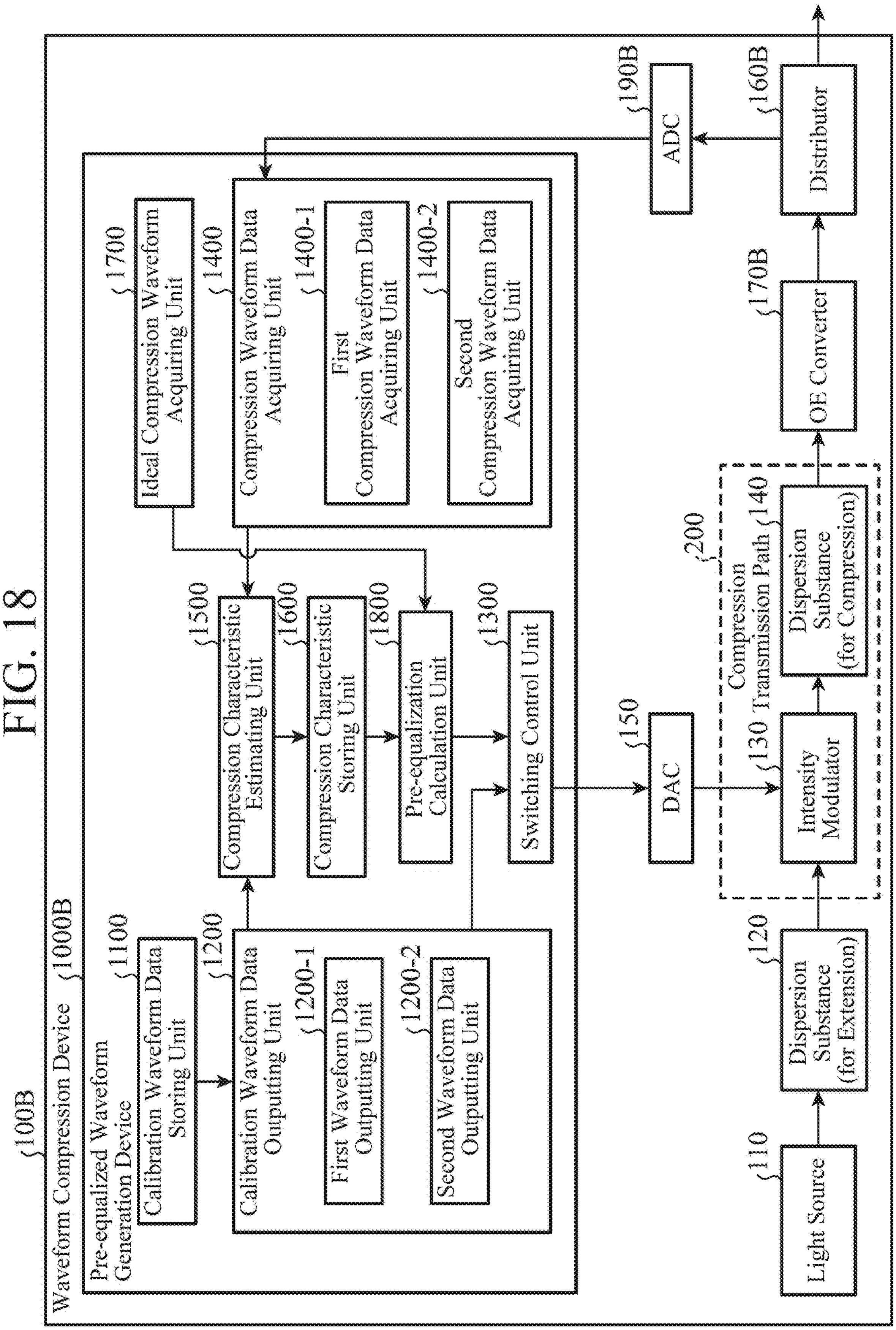
FIG. 18 is a diagram illustrating a second modification of a configuration of a waveform compression device including a pre-equalized waveform generation device according to the first embodiment of the present disclosure.

FIG. 18 is a diagram illustrating a second modification of a configuration of a waveform compression device 100B including a pre-equalized waveform generation device 1000B according to the first embodiment of the present disclosure.

The waveform compression device 100B includes a light source 110, a dispersion substance (dispersion substance for extension) 120, an intensity modulator 130, a dispersion substance (dispersion substance for compression) 140, a digital-to-analog converter (DAC) 150, a distributor 160B, an OE converter (first OE converter) 170B, an analog-to-digital converter (ADC) 190B, and the pre-equalized waveform generation device 1000B.

The light source 110, the dispersion substance (dispersion substance for extension) 120, the intensity modulator 130, the dispersion substance (dispersion substance for compression) 140, and the digital-to-analog converter (DAC) 150 have configurations similar to those illustrated in FIG. 1, and thus a detailed description thereof is omitted here.

Since the pre-equalized waveform generation device 1000B has the configuration similar to that of the pre-equalized waveform generation device 1000 illustrated in FIG. 1, a detailed description thereof is omitted here.

The OE converter (first OE converter) 170B converts a light wave into an electric signal.

The OE converter 170B illustrated in FIG. 18 is disposed between the dispersion substance 140 and the distributor 160B, converts a light signal including a light wave output from the dispersion substance 140 into an electric signal, and outputs the electric signal to the distributor 160B.

The OE converter 170 shown in FIG. 18 is the first OE converter in the present disclosure.

The distributor 160B is disposed on a transmission path and extracts a part of the light wave passing through the transmission path.

The distributor 160B illustrated in FIG. 18 is a distributor disposed at a subsequent stage of the compression transmission path 200 and a subsequent stage of the OE converter 170B, and extracts a part of the light wave output from the compression transmission path 200 and outputs it to the analog-to-digital converter 190B.

The analog-to-digital converter (ADC) 190B converts an analog waveform indicated by the input electric signal into waveform data (digital data).

The analog-to-digital converter 190B illustrated in FIG. 18 receives the compression waveform compressed by the compression transmission path 200, performs sampling to convert it into compression waveform data that is time-series digital data, and outputs the converted compression waveform data to the pre-equalized waveform generation device 1000B.

With the configuration of the second modification, the pre-equalized waveform generation device 1000B shares the OE converter (first OE converter) 170B of the waveform compression device 100B, so that the configuration of the waveform compression device 100B can be downsized.

The present disclosure has disclosed the following configuration.

A pre-equalized waveform generation device including:

- a calibration waveform data outputting unit to output first waveform data for calibration and second waveform data for calibration represented by an expression having a different order of a time variable from an expression representing the first waveform data;
- a compression waveform data acquiring unit to acquire first compression waveform data indicating a waveform modulated using the first waveform data and compressed via a compression transmission path and to acquire second compression waveform data indicating a waveform modulated using the second waveform data and compressed via the compression transmission path;
- a compression characteristic estimating unit to estimate a compression characteristic that is a characteristic of the compression transmission path by using the first compression waveform data and the second compression waveform data; and
- a pre-equalization calculation unit to calculate pre-equalized waveform data by using ideal compression waveform data generated on the basis of a signal waveform and the compression characteristic.

As a result, the present disclosure can provide a pre-equalized waveform generation device that generates a pre-equalized waveform capable of suppressing distortion in a compression waveform.

Furthermore, the pre-equalized waveform generation device can further suppress distortion due to the compression transmission path for any signal waveform. As a result, it can be used in a device using any signal such as a communication signal or a fixed cycle signal such as a clock.

The present disclosure has disclosed the following configuration.

A waveform compression device including an intensity modulator and a compression transmission path and to compress a waveform modulated by the intensity modulator via the compression transmission path, the waveform compression device including:

- a calibration waveform data outputting unit to output, to the intensity modulator, first waveform data for calibration and second waveform data for calibration represented by an expression having a different order of a time variable from an expression representing the first waveform data;
- a distributor disposed at a subsequent stage of the compression transmission path;
- a compression waveform data acquiring unit to acquire, via the distributor, first compression waveform data indicating a waveform modulated by the intensity modulator using the first waveform data and compressed via the compression transmission path and to acquire, via the distributor, second compression waveform data indicating a waveform modulated by the intensity modulator using the second waveform data and compressed via the compression transmission path;
- a compression characteristic estimating unit to estimate a compression characteristic that is a characteristic of the compression transmission path by using the first compression waveform data and the second compression waveform data; and
- a pre-equalization calculation unit to generate ideal compression waveform data indicating an ideal compression waveform on the basis of a signal waveform and to calculate pre-equalized waveform data by using the compression characteristic and the ideal compression waveform data.

As a result, the present disclosure can provide a waveform compression device that generates a pre-equalized waveform capable of suppressing distortion in a compression waveform.

Furthermore, the waveform compression device can further suppress distortion due to the compression transmission path for any signal waveform. As a result, it can be used in a device using any signal such as a communication signal or a fixed cycle signal such as a clock.

The present disclosure has disclosed the following configuration.

A pre-equalized waveform generation method including:

- a calibration waveform data outputting step of outputting, by a calibration waveform data outputting unit, first waveform data for calibration and second waveform data for calibration represented by an expression having a different order of a time variable from an expression representing the first waveform data;
- a compression waveform data acquiring step of acquiring, by a compression waveform data acquiring unit, first compression waveform data indicating a waveform modulated using the first waveform data and compressed via a compression transmission path and acquiring second compression waveform data indicating a waveform modulated using the second waveform data and compressed via the compression transmission path;
- a compression characteristic estimating step of estimating, by a compression characteristic estimating unit, a compression characteristic that is a characteristic of the compression transmission path by using the first compression waveform data and the second compression waveform data; and a pre-equalization calculating step of calculating, by a pre-equalization calculation unit, pre-equalized waveform data by using ideal compression waveform data generated on the basis of a signal waveform and the compression characteristic.

As a result, the present disclosure has an effect of providing a pre-equalized waveform generation method for generating a pre-equalized waveform capable of suppressing distortion in a compression waveform.

Furthermore, the pre-equalized waveform generation method can further suppress distortion due to the compression transmission path for any signal waveform. As a result, the pre-equalized waveform generation method can be used in a method using an arbitrary signal such as a communication signal or a fixed cycle signal such as a clock.

The present disclosure has further disclosed the following configuration.

The pre-equalized waveform generation device including a compression characteristic storing unit 1600 to store the compression characteristic estimated by the compression characteristic estimating unit, in which the pre-equalization calculation unit acquires and uses the compression characteristic from the compression characteristic storing unit.

As a result, the present disclosure further has an effect that pre-equalized waveform data can be generated for any waveform data input from the outside of the device.

Furthermore, the present disclosure further has an effect that a processing load can be reduced by not repeatedly performing processing related to estimation of the compression characteristic.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which the calibration waveform data outputting unit outputs three or more waveform data including the first waveform data and the second waveform data at different timings, the compression waveform data acquiring unit acquires three or more compression waveform data including the first compression waveform data and the second compression waveform data at different timings, and the compression characteristic estimating unit estimates a compression characteristic by using the three or more compression waveform data including the first compression waveform data and the second compression waveform data.

As a result, the present disclosure further has an effect that the compression characteristic of the compression transmission path can be estimated with high accuracy, and a highly accurate pre-equalized waveform can be generated in such a manner that distortion of the compression waveform due to the nonlinear compression characteristic of the compression transmission path is further reduced.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which a waveform of the first waveform data is a waveform represented by a constant function, and a waveform of the second waveform data is a waveform represented by a linear function.

As a result, the present disclosure further has an effect of providing a configuration that does not excessively increase a load of calculation processing related to the pre-equalization.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which a waveform of the first waveform data is a waveform represented by a constant function, a waveform of the second waveform data is a waveform represented by a linear function, the calibration waveform data outputting unit further outputs third waveform data for calibration represented by a constant function different from the constant function representing the waveform of the first waveform data, the compression waveform data acquiring unit further acquires third compression waveform data indicating a waveform modulated using the third waveform data and compressed via the compression transmission path, and the compression characteristic estimating unit estimates a compression characteristic that is a characteristic of the compression transmission path by using the first compression waveform data, the second compression waveform data, and the third compression waveform data.

As a result, the present disclosure further has an effect that the compression characteristic of the compression transmission path can be estimated with high accuracy, and a highly accurate pre-equalized waveform can be generated in such a manner that distortion of the compression waveform due to the nonlinear compression characteristic of the compression transmission path is further reduced.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which a waveform of the first waveform data is a waveform represented by a constant function, a waveform of the second waveform data is a waveform represented by a linear function, the calibration waveform data outputting unit further outputs third waveform data for calibration represented by a linear function different from the linear function representing the waveform of the second waveform data, in addition to the first waveform data and the second waveform data, the compression waveform data acquiring unit further acquires third compression waveform data indicating a waveform modulated using the third waveform data and compressed via the compression transmission path, and the compression characteristic estimating unit estimates a compression characteristic that is a characteristic of the compression transmission path by using the first compression waveform data, the second compression waveform data, and the third compression waveform data.

As a result, the present disclosure further has an effect that the compression characteristic of the compression transmission path can be estimated with high accuracy, and a highly accurate pre-equalized waveform can be generated in such a manner that distortion of the compression waveform due to the nonlinear compression characteristic of the compression transmission path is further reduced.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which the calibration waveform data outputting unit further outputs third waveform data that is the same waveform data as the first waveform data or the second waveform data, in addition to the first waveform data and the second waveform data, the compression waveform data acquiring unit further acquires third compression waveform data indicating a waveform modulated using the third waveform data and compressed via the compression transmission path, and the compression characteristic estimating unit estimates a compression characteristic that is a characteristic of the compression transmission path by using the first compression waveform data, the second compression waveform data, and the third compression waveform data.

As a result, the present disclosure further has an effect that the compression characteristic of the compression transmission path can be estimated with high accuracy, and a highly accurate pre-equalized waveform can be generated in such a manner that distortion of the compression waveform due to the nonlinear compression characteristic of the compression transmission path is further reduced.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which a waveform of at least one waveform data of the three or more waveform data including the first waveform data and the second waveform data is a waveform represented by a function having a second or higher order.

As a result, the present disclosure further has an effect that the compression characteristic of the compression transmission path can be estimated with high accuracy, and a highly accurate pre-equalized waveform can be generated in such a manner that distortion of the compression waveform due to the nonlinear compression characteristic of the compression transmission path is further reduced.

In addition, in a case where the present disclosure is used in the waveform compression device or the pre-equalized waveform generation method, each of the used waveform compression device or pre-equalized waveform generation method has an effect similar to the above effect.

The present disclosure has disclosed the following configuration.

The pre-equalized waveform generation device, in which by using a compression function differential value obtained by upsampling a differential value of a compression function indicating a time change in an expression representing an output waveform with reference to the compression transmission path by an input waveform, a sampling time timing of input waveform data indicating the input waveform, a compression function value obtained by upsampling a value of the compression function, and a sampling time timing of the upsampled compression function value, the compression characteristic estimating unit extracts the sampling time timing after upsampling corresponding to the sampling time timing of the input waveform data, and outputs the compression characteristic including the compression function differential value at the extracted sampling time timing, and the pre-equalization calculation unit calculates the pre-equalized waveform data by dividing the ideal compression waveform data by the compression function differential value for each of the sampling time timings extracted by the compression characteristic estimating unit.

As a result, the present disclosure further has an effect that a highly accurate pre-equalized waveform can be generated using more suitable data.

In addition, in a case where the present disclosure is used in the waveform compression device or the pre-equalized waveform generation method, each of the used waveform compression device or pre-equalized waveform generation method has an effect similar to the above effect.

Second Embodiment

A second embodiment is a mode that makes it possible to update a compression characteristic in a case where an environmental change such as a temperature change over time occurs.

In a description of the second embodiment, a description of the configuration described in the first embodiment is appropriately omitted.

Figure 19:
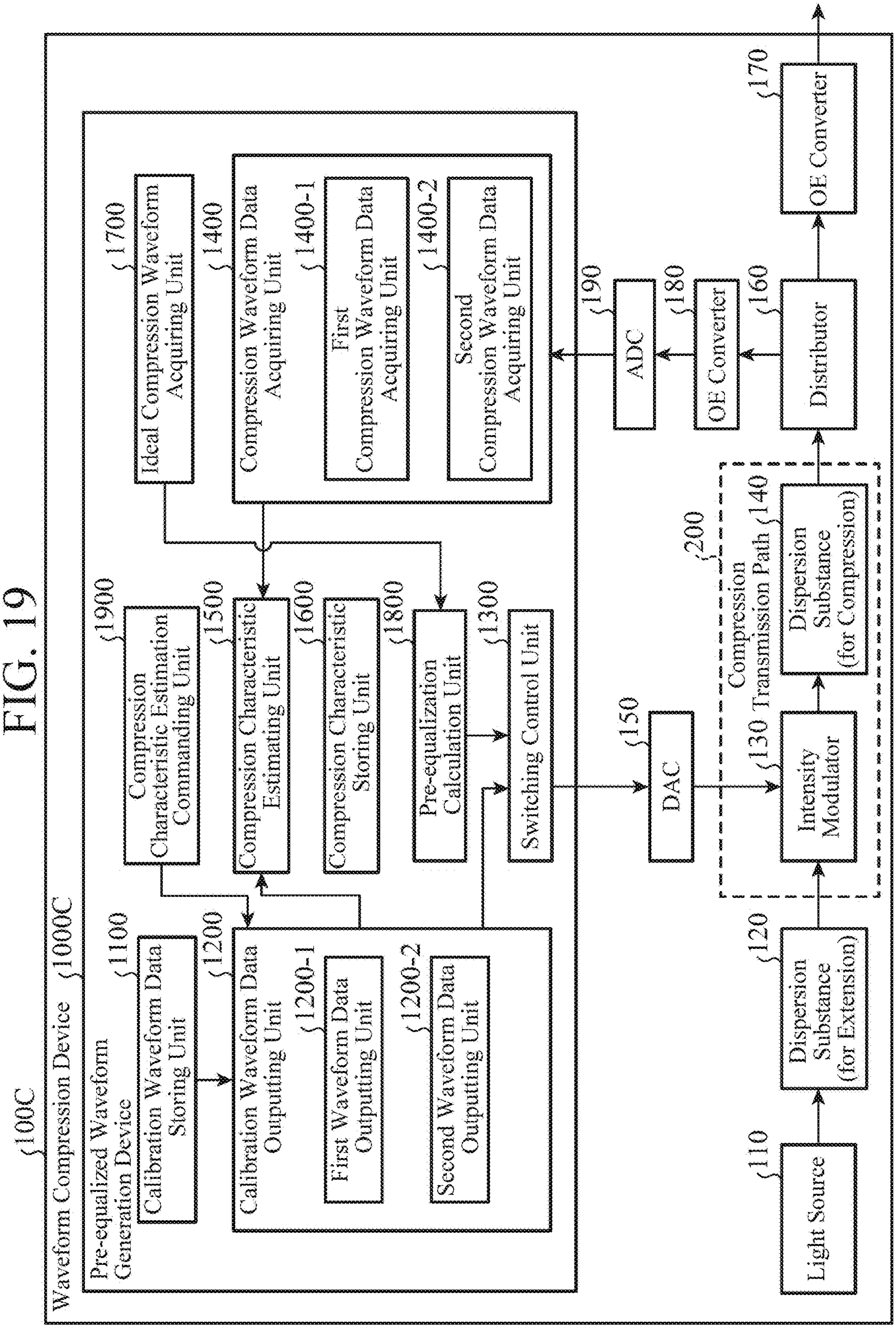
FIG. 19 is a diagram illustrating a configuration example of a waveform compression device including a pre-equalized waveform generation device according to a second embodiment of the present disclosure.

FIG. 19 is a diagram illustrating a configuration example of a waveform compression device 100C including a pre-equalized waveform generation device 1000C according to the second embodiment of the present disclosure.

The waveform compression device 100C is different from the waveform compression device 100 of FIG. 1 in the pre-equalized waveform generation device 1000C.

In the description, description of configurations other than that of the pre-equalized waveform generation device 1000C in the waveform compression device 100C is omitted.

The pre-equalized waveform generation device 1000C includes a calibration waveform data storing unit 1100, a calibration waveform data outputting unit 1200, a switching control unit 1300, a compression waveform data acquiring unit 1400, a compression characteristic estimating unit 1500, a compression characteristic storing unit 1600, an ideal compression waveform acquiring unit 1700, a pre-equalization calculation unit 1800, a compression characteristic estimation commanding unit 1900, and a control unit (not illustrated).

In the pre-equalized waveform generation device 1000C, configurations other than that of the compression characteristic estimation commanding unit 1900 overlap with the content already described, and thus a detailed description thereof is omitted here.

The compression characteristic estimation commanding unit 1900 has a function of issuing a command to update a compression characteristic.

The compression characteristic estimation commanding unit 1900 causes output of the pre-equalized waveform data to be stopped depending on a signal acquired from the outside of the device, causes the calibration waveform data outputting unit to output calibration waveform data, causes the compression characteristic estimating unit 1500 to calculate a compression characteristic, and causes the compression characteristic used for processing performed by the pre-equalization calculation unit 1800 to be updated.

The pre-equalized waveform generation device 1000C including the compression characteristic estimation commanding unit 1900 can further update the compression characteristic used for the pre-equalization calculation processing, and can generate a pre-equalized waveform using the updated compression characteristic depending on variation in a compression characteristic of an environmental factor such as temperature variation.

Processing performed by the pre-equalized waveform generation device 1000C including the compression characteristic estimation commanding unit 1900 is different only in that the compression characteristic estimation commanding unit 1900 can command the start of the processing, and the processing already described is similar. Thus, a detailed description thereof is omitted here.

A modification of the pre-equalized waveform generation device 1000C illustrated in FIG. 19 will be described.

Figure 20:
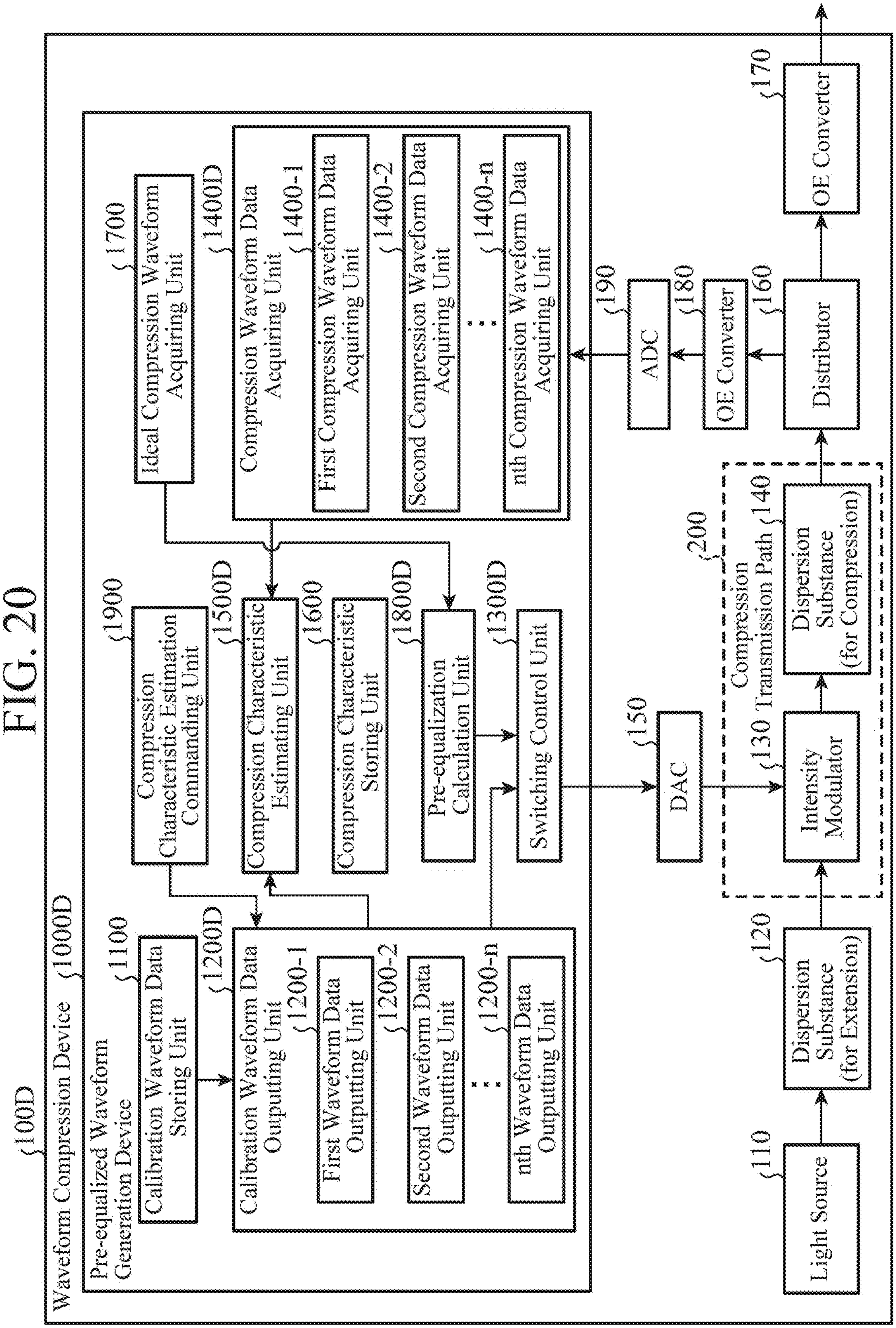
FIG. 20 is a diagram illustrating a first modification of a configuration of a waveform compression device including a pre-equalized waveform generation device according to the second embodiment of the present disclosure.

FIG. 20 is a diagram illustrating a first modification of a configuration of a waveform compression device 100D including a pre-equalized waveform generation device 1000D according to the second embodiment of the present disclosure.

The pre-equalized waveform generation device 1000D illustrated in FIG. 20 is different from the configuration of the pre-equalized waveform generation device 1000A illustrated in FIG. 16 described above only in that the compression characteristic estimation commanding unit 1900 is included, and thus a detailed description thereof is omitted here.

Examples of the calibration waveform data output processing and the compression waveform data acquisition processing in the pre-equalized waveform generation device 1000D are similar to the processing described in FIG. 16 in the first modification of the first embodiment, and thus, a detailed description thereof is omitted here.

With the configuration of the first modification, the pre-equalized waveform generation device 1000D can accurately estimate the compression characteristic of the compression transmission path, and can generate a pre-equalized waveform with high accuracy in such a manner that distortion of the compression waveform due to the nonlinear compression characteristic in the compression transmission path is further reduced.

Figure 21:
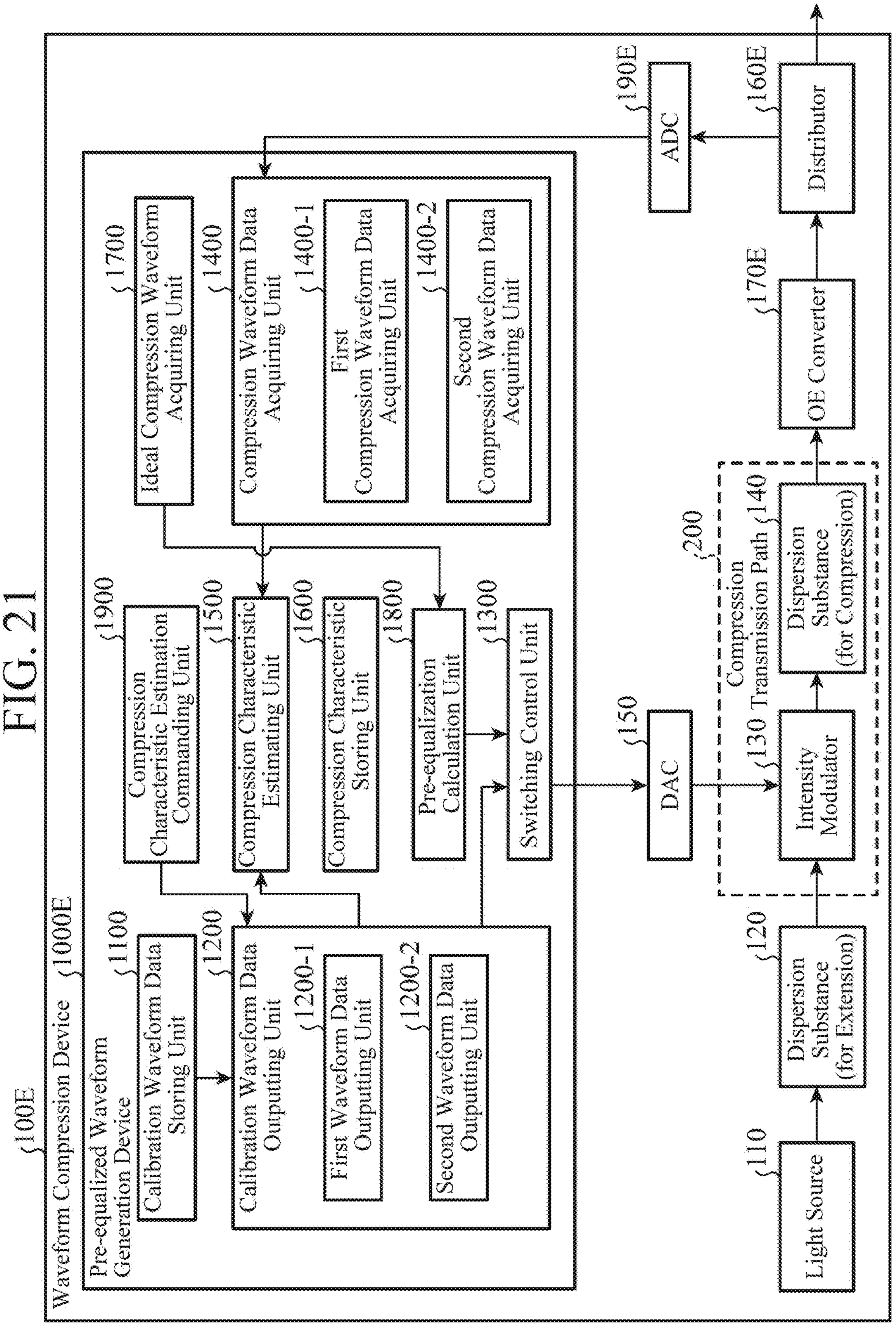
FIG. 21 is a diagram illustrating a second modification of a configuration of a waveform compression device including a pre-equalized waveform generation device according to the second embodiment of the present disclosure.

FIG. 21 is a diagram illustrating a second modification of a configuration of a waveform compression device 100E including a pre-equalized waveform generation device 1000E according to the second embodiment of the present disclosure.

The pre-equalized waveform generation device 1000E illustrated in FIG. 21 is different from the configuration of the pre-equalized waveform generation device 1000B illustrated in FIG. 18 described above only in that the compression characteristic estimation commanding unit 1900 is included, and thus a detailed description thereof is omitted here.

With the configuration of the second modification, the pre-equalized waveform generation device 1000E shares an OE converter (first OE converter) 170E of the waveform compression device 100E, so that a configuration of the waveform compression device 100E can be downsized.

The present disclosure has disclosed the following configuration.

The pre-equalized waveform generation device 1000 further including a compression characteristic estimation commanding unit 1900 to cause output of the pre-equalized waveform data to be stopped depending on a signal acquired from the outside of the device, and to cause the calibration waveform data outputting unit to output the calibration waveform data, and to cause the compression characteristic estimating unit 1500 to calculate the compression characteristic, and to cause the compression characteristic used for processing performed by the pre-equalization calculation unit 1800 to be updated.

As a result, the present disclosure further has an effect that the compression characteristic used in the pre-equalization calculation processing can be updated, and a pre-equalized waveform can be generated using the updated compression characteristic depending on variation in a compression characteristic of an environmental factor such as temperature variation.

In addition, in a case where the present disclosure is used in the waveform compression device or the pre-equalized waveform generation method, each of the used waveform compression device or pre-equalized waveform generation method has an effect similar to the above effect.

Here, a hardware configuration that implements the functions of the pre-equalized waveform generation device 1000 according to the present disclosure will be described.

Figure 22:
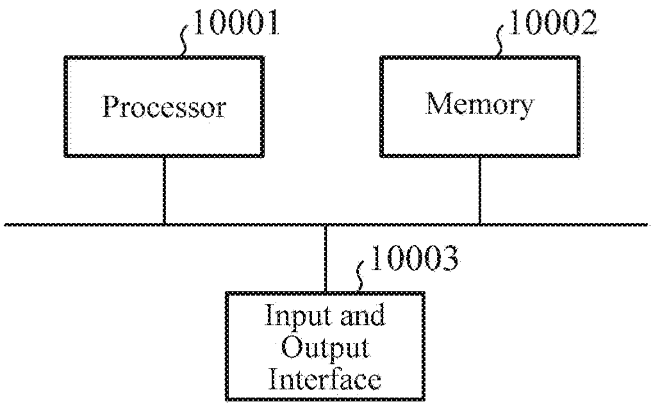
FIG. 22 is a diagram illustrating a first example of a hardware configuration for implementing functions of the pre-equalized waveform generation device according to the present disclosure.

FIG. 22 is a diagram illustrating a first example of a hardware configuration for implementing the functions of the pre-equalized waveform generation device 1000 according to the present disclosure.

Figure 23:
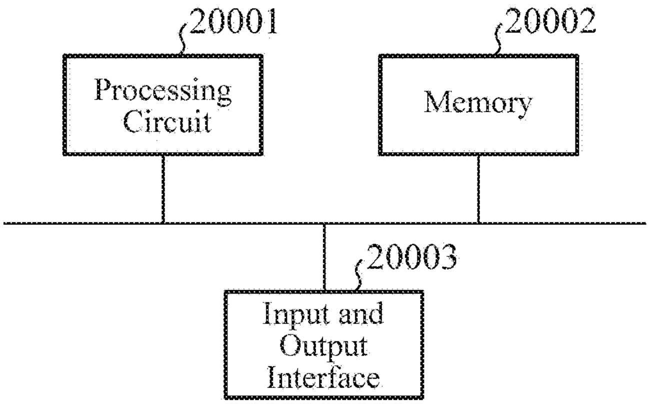
FIG. 23 is a diagram illustrating a second example of a hardware configuration for implementing the functions of the pre-equalized waveform generation device according to the present disclosure.

FIG. 23 is a diagram illustrating a second example of a hardware configuration for implementing the functions of the pre-equalized waveform generation device 1000 according to the present disclosure.

The pre-equalized waveform generation device 1000 of the present disclosure is implemented by hardware as illustrated in FIG. 22 or 23.

As illustrated in FIG. 22, the pre-equalized waveform generation device 1000 includes, for example, a processor 10001, a memory 10002, and an input and output interface 10003.

The processor 10001 and the memory 10002 are mounted on a computer, for example.

The memory 10002 stores a program for causing the computer to function as the calibration waveform data outputting units 1200, 1200A, and 1200D, the first waveform data outputting unit 1200-1, the second waveform data outputting unit 1200-2, the nth waveform data outputting unit **1200-*n*, the switching control units 1300, 1300A, and 1300D, the compression waveform data acquiring units 1400, 1400A, and 1400D, the first compression waveform data acquiring unit 1400-1, the second compression waveform data acquiring unit 1400-2, the nth compression waveform data acquiring unit 1400-*n*, the compression characteristic estimating units 1500, 1500A, and 1500D, the compression function differential value calculating unit 1510, the compression function value calculating unit 1520, the upsampling processing unit 1530, the upsampling processing unit 1540, the DAC temporal resolution acquiring unit 1550, the extraction unit 1560, the ideal compression waveform acquiring unit 1700, the arbitrary waveform data acquiring unit 1710, the ADC temporal resolution acquiring unit 1720, the upsampling processing unit 1730, the ideal compression waveform generating unit 1740, the pre-equalization calculation units 1800, 1800A, and 1800D, the element array converting unit 1880, the pre-equalized waveform data calculating unit 1890, the compression characteristic estimation commanding unit 1900, and the control unit (not illustrated). By reading and executing the program stored in the memory 10002 by the processor 10001, the functions of the calibration waveform data outputting units 1200, 1200A, and 1200D, the first waveform data outputting unit 1200-1, the second waveform data outputting unit 1200-2, the nth waveform data outputting unit 1200**-*n*, the switching control units 1300, 1300A, and 1300D, the compression waveform data acquiring units 1400, 1400A, and 1400D, the first compression waveform data acquiring unit 1400-1, the second compression waveform data acquiring unit 1400-2, the nth compression waveform data acquiring unit 1400-*n*, the compression characteristic estimating units 1500, 1500A, and 1500D, the compression function differential value calculating unit 1510, the compression function value calculating unit 1520, the upsampling processing unit 1530, the upsampling processing unit 1540, the DAC temporal resolution acquiring unit 1550, the extraction unit 1560, the ideal compression waveform acquiring unit 1700, the arbitrary waveform data acquiring unit 1710, the ADC temporal resolution acquiring unit 1720, the upsampling processing unit 1730, the ideal compression waveform generating unit 1740, the pre-equalization calculation units 1800, 1800A, and 1800D, the element array converting unit 1880, the pre-equalized waveform data calculating unit 1890, the compression characteristic estimation commanding unit 1900, and the control unit (not illustrated) are implemented.

In addition, the memory 10002 or another memory (not illustrated) implements the calibration waveform data storing unit 1100, the compression characteristic storing unit 1600, and a storage unit (not illustrated).

The processor 10001 uses, for example, a central processing unit (CPU), a graphics processing unit (GPU), a microprocessor, a microcontroller, a digital signal processor (DSP), or the like.

The memory 10002 may be a nonvolatile or volatile semiconductor memory such as a random access memory (RAM), a read only memory (ROM), an erasable programmable ROM (EPROM), an electrically erasable programmable read only memory (EEPROM), or a flash memory, may be a magnetic disk such as a hard disk or a flexible disk, may be an optical disk such as a compact disc (CD) or a digital versatile disc (DVD), or may be a magneto-optical disk.

The processor 10001 and the memory 10002 are connected in a state in which data can be transmitted to each other. In addition, the processor 10001 and the memory 10002 are connected in a state in which data can be mutually transmitted with other hardware via an input and output interface 10003.

Note that, in a case where the DSP is used, the DSP may be configured to be able to implement all functions in the pre-equalized waveform generation device 1000.

Alternatively, the functions of the calibration waveform data outputting units 1200, 1200A, and 1200D, the first waveform data outputting unit 1200-1, the second waveform data outputting unit 1200-2, the nth waveform data outputting unit 1200-*n*, the switching control units 1300, 1300A, and 1300D, the compression waveform data acquiring units 1400, 1400A, and 1400D, the first compression waveform data acquiring unit 1400-1, the second compression waveform data acquiring unit 1400-2, the nth compression waveform data acquiring unit 1400-*n*, the compression characteristic estimating units 1500, 1500A, and 1500D, the compression function differential value calculating unit 1510, the compression function value calculating unit 1520, the upsampling processing unit 1530, the upsampling processing unit 1540, the DAC temporal resolution acquiring unit 1550, the extraction unit 1560, the ideal compression waveform acquiring unit 1700, the arbitrary waveform data acquiring unit 1710, the ADC temporal resolution acquiring unit 1720, the upsampling processing unit 1730, the ideal compression waveform generating unit 1740, the pre-equalization calculation units 1800, 1800A, and 1800D, the element array converting unit 1880, the pre-equalized waveform data calculating unit 1890, the compression characteristic estimation commanding unit 1900, and the control unit (not illustrated) may be implemented by a dedicated processing circuit 20001 as illustrated in FIG. 23.

The processing circuit 20001 uses, for example, a single circuit, a composite circuit, a programmed processor, a parallel programmed processor, an application specific integrated circuit (ASIC), a programmable logic device (PLD), a field-programmable gate array (FPGA), a system-on-a-chip (SoC), a system large-scale integration (LSI), or the like.

In addition, a memory 20002 or another memory (not illustrated) implements the calibration waveform data storing unit 1100, the compression characteristic storing unit 1600, and a storage unit (not illustrated).

The memory 20002 may be a nonvolatile or volatile semiconductor memory such as a random access memory (RAM), a read only memory (ROM), an erasable programmable ROM (EPROM), an electrically erasable programmable read only memory (EEPROM), or a flash memory, may be a magnetic disk such as a hard disk or a flexible disk, may be an optical disk such as a compact disc (CD) or a digital versatile disc (DVD), or may be a magneto-optical disk.

The processing circuit 20001 and the memory 20002 are connected in a state in which data can be transmitted to each other. In addition, the processing circuit 20001 and the memory 20002 are connected in a state in which data can be mutually transmitted with other hardware via an input and output interface 20003.

Note that the functions of the calibration waveform data outputting units 1200, 1200A, and 1200D, the first waveform data outputting unit 1200-1, the second waveform data outputting unit 1200-2, the nth waveform data outputting unit 1200-*n*, the switching control units 1300, 1300A, and 1300D, the compression waveform data acquiring units 1400, 1400A, and 1400D, the first compression waveform data acquiring unit 1400-1, the second compression waveform data acquiring unit 1400-2, the nth compression waveform data acquiring unit 1400-*n*, the compression characteristic estimating units 1500, 1500A, and 1500D, the compression function differential value calculating unit 1510, the compression function value calculating unit 1520, the upsampling processing unit 1530, the upsampling processing unit 1540, the DAC temporal resolution acquiring unit 1550, the extraction unit 1560, the ideal compression waveform acquiring unit 1700, the arbitrary waveform data acquiring unit 1710, the ADC temporal resolution acquiring unit 1720, the upsampling processing unit 1730, the ideal compression waveform generating unit 1740, the pre-equalization calculation units 1800, 1800A, and 1800D, the element array converting unit 1880, the pre-equalized waveform data calculating unit 1890, the compression characteristic estimation commanding unit 1900, and the control unit (not illustrated) may be implemented by different processing circuits, or may be collectively implemented by a processing circuit.

Alternatively, a part of the functions of the calibration waveform data outputting units 1200, 1200A, and 1200D, the first waveform data outputting unit 1200-1, the second waveform data outputting unit 1200-2, the nth waveform data outputting unit 1200-*n*, the switching control units 1300, 1300A, and 1300D, the compression waveform data acquiring units 1400, 1400A, and 1400D, the first compression waveform data acquiring unit 1400-1, the second compression waveform data acquiring unit 1400-2, the nth compression waveform data acquiring unit 1400-*n*, the compression characteristic estimating units 1500, 1500A, and 1500D, the compression function differential value calculating unit 1510, the compression function value calculating unit 1520, the upsampling processing unit 1530, the upsampling processing unit 1540, the DAC temporal resolution acquiring unit 1550, the extraction unit 1560, the ideal compression waveform acquiring unit 1700, the arbitrary waveform data acquiring unit 1710, the ADC temporal resolution acquiring unit 1720, the upsampling processing unit 1730, the ideal compression waveform generating unit 1740, the pre-equalization calculation units 1800, 1800A, and 1800D, the element array converting unit 1880, the pre-equalized waveform data calculating unit 1890, the compression characteristic estimation commanding unit 1900, and the control unit (not illustrated) may be implemented by the processor 10001 and the memory 10002, and the remaining functions may be implemented by the processing circuit 20001.

Note that the present disclosure can freely combine the embodiments, modify any components in the embodiments, or omit any components in the embodiments within the scope of the invention.

An example of a configuration and a combination of configurations according to the present disclosure will be described below.

(Note 1)

A pre-equalized waveform generation device including:

a calibration waveform data outputting unit to output first waveform data for calibration and second waveform data for calibration represented by an expression having a different order of a time variable from an expression representing the first waveform data;

a compression waveform data acquiring unit to acquire first compression waveform data indicating a waveform modulated using the first waveform data and compressed via a compression transmission path and to acquire second compression waveform data indicating a waveform modulated using the second waveform data and compressed via the compression transmission path;

a compression characteristic estimating unit to estimate a compression characteristic that is a characteristic of the compression transmission path by using the first compression waveform data and the second compression waveform data; and a pre-equalization calculation unit to calculate pre-equalized waveform data by using ideal compression waveform data generated on the basis of a signal waveform and the compression characteristic.

(Note 2)

The pre-equalized waveform generation device according to (note 1), including a compression characteristic storing unit to store the compression characteristic estimated by the compression characteristic estimating unit, in which the pre-equalization calculation unit acquires the compression characteristic from the compression characteristic storing unit.

(Note 3)

The pre-equalized waveform generation device according to (note 1) or (note 2), in which the calibration waveform data outputting unit outputs three or more waveform data including the first waveform data and the second waveform data at different timings, the compression waveform data acquiring unit acquires three or more compression waveform data including the first compression waveform data and the second compression waveform data at different timings, and the compression characteristic estimating unit estimates a compression characteristic by using the three or more compression waveform data including the first compression waveform data and the second compression waveform data.

(Note 4)

The pre-equalized waveform generation device according to (note 1), (note 2), or (note 3), in which a waveform of the first waveform data is a waveform represented by a constant function, and a waveform of the second waveform data is a waveform represented by a linear function.

(Note 5)

The pre-equalized waveform generation device according to (note 3), in which a waveform of the first waveform data is a waveform represented by a constant function, a waveform of the second waveform data is a waveform represented by a linear function, the calibration waveform data outputting unit further outputs third waveform data for calibration represented by a constant function different from the constant function representing the waveform of the first waveform data, the compression waveform data acquiring unit further acquires third compression waveform data indicating a waveform modulated using the third waveform data and compressed via the compression transmission path, and the compression characteristic estimating unit estimates a compression characteristic that is a characteristic of the compression transmission path by using the first compression waveform data, the second compression waveform data, and the third compression waveform data.

(Note 6)

The pre-equalized waveform generation device according to (note 3), in which a waveform of the first waveform data is a waveform represented by a constant function, a waveform of the second waveform data is a waveform represented by a linear function, the calibration waveform data outputting unit further outputs third waveform data for calibration represented by a linear function different from the linear function representing the waveform of the second waveform data, in addition to the first waveform data and the second waveform data, the compression waveform data acquiring unit further acquires third compression waveform data indicating a waveform modulated using the third waveform data and compressed via the compression transmission path, and the compression characteristic estimating unit estimates a compression characteristic that is a characteristic of the compression transmission path by using the first compression waveform data, the second compression waveform data, and the third compression waveform data.

(Note 7)

The pre-equalized waveform generation device according to (note 3), in which the calibration waveform data outputting unit further outputs third waveform data that is the same waveform data as the first waveform data or the second waveform data, in addition to the first waveform data and the second waveform data, the compression waveform data acquiring unit further acquires third compression waveform data indicating a waveform modulated using the third waveform data and compressed via the compression transmission path, and the compression characteristic estimating unit estimates a compression characteristic that is a characteristic of the compression transmission path by using the first compression waveform data, the second compression waveform data, and the third compression waveform data.

(Note 8)

The pre-equalized waveform generation device according to (note 3), in which a waveform of at least one waveform data of the three or more waveform data including the first waveform data and the second waveform data is a waveform represented by a function having a second or higher order.

(Note 9)

The pre-equalized waveform generation device according to any one of (note 1), (note 2), (note 3), (note 4), (note 5), (note 6), (note 7), and (note 8), further including a compression characteristic estimation commanding unit to cause output of the pre-equalized waveform data to be stopped depending on a signal acquired from the outside of the device, and to cause the calibration waveform data outputting unit to output calibration waveform data, and to cause the compression characteristic estimating unit to calculate the compression characteristic, and to cause the compression characteristic used for processing performed by the pre-equalization calculation unit to be updated.

(Note 10)

The pre-equalized waveform generation device according to any one of (note 1), (note 2), (note 3), (note 4), (note 5), (note 6), (note 7), (note 8), and (note 9), in which by using a compression function differential value obtained by upsampling a differential value of a compression function indicating a time change in an expression representing an output waveform with reference to the compression transmission path by an input waveform, a sampling time timing of input waveform data indicating the input waveform, a compression function value obtained by upsampling a value of the compression function, and a sampling time timing of the upsampled compression function value, the compression characteristic estimating unit extracts the sampling time timing after upsampling corresponding to the sampling time timing of the input waveform data, and outputs the compression characteristic including the compression function differential value at the extracted sampling time timing, and the pre-equalization calculation unit calculates the pre-equalized waveform data by dividing the ideal compression waveform data by the compression function differential value for each of the sampling time timings extracted by the compression characteristic estimating unit.

(Note 11)

A waveform compression device including an intensity modulator and a compression transmission path and to compress a waveform modulated by the intensity modulator via the compression transmission path, the waveform compression device including:

a calibration waveform data outputting unit to output, to the intensity modulator, first waveform data for calibration and second waveform data for calibration represented by an expression having a different order of a time variable from an expression representing the first waveform data;

a distributor disposed at a subsequent stage of the compression transmission path;

a compression waveform data acquiring unit to acquire, via the distributor, first compression waveform data indicating a waveform modulated by the intensity modulator using the first waveform data and compressed via the compression transmission path and to acquire, via the distributor, second compression waveform data indicating a waveform modulated by the intensity modulator using the second waveform data and compressed via the compression transmission path;

a compression characteristic estimating unit to estimate a compression characteristic that is a characteristic of the compression transmission path by using the first compression waveform data and the second compression waveform data; and a pre-equalization calculation unit to generate ideal compression waveform data indicating an ideal compression waveform on the basis of a signal waveform and calculates pre-equalized waveform data by using the compression characteristic and the ideal compression waveform data.

(Note 12)

A pre-equalized waveform generation method including:

a calibration waveform data outputting step of outputting, by a calibration waveform data outputting unit, first waveform data for calibration and second waveform data for calibration represented by an expression having a different order of a time variable from an expression representing the first waveform data;

a compression waveform data acquiring step of acquiring, by a compression waveform data acquiring unit, first compression waveform data indicating a waveform modulated using the first waveform data and compressed via a compression transmission path and acquiring second compression waveform data indicating a waveform modulated using the second waveform data and compressed via the compression transmission path;

a compression characteristic estimating step of estimating, by a compression characteristic estimating unit, a compression characteristic that is a characteristic of the compression transmission path by using the first compression waveform data and the second compression waveform data; and a pre-equalization calculating step of calculating, by a pre-equalization calculation unit, pre-equalized waveform data by using ideal compression waveform data generated on the basis of a signal waveform and the compression characteristic.

INDUSTRIAL APPLICABILITY

The pre-equalized waveform generation technology (pre-equalized waveform generation device, waveform compression device, and pre-equalized waveform generation method) according to the present disclosure can generate a pre-equalized waveform capable of suppressing distortion in a compression waveform, and thus is suitable for use in a waveform compression device in a communication device or the like, for example.

REFERENCE SIGNS LIST

100, 100A, 100B, 100C, 100D, 100E: waveform compression device, 110: light source, 120: dispersion substance (dispersion substance for extension), 130: light intensity modulator, 140: dispersion substance (dispersion substance for compression), 150: digital-to-analog converter (DAC), 160, 160B, 160E: optical distributor, 170, 170B, 170E: OE converter (first OE converter), 180: OE converter (second OE converter), 190, 190B, 190E: analog-to-digital converter (ADC), 1000, 1000A, 1000B, 1000C, 1000D, 1000E: pre-equalized waveform generation device, 1100: calibration waveform data storing unit, 1200, 1200A, 1200D: calibration waveform data outputting unit, 1200-1: first waveform data outputting unit, 1200-2: second waveform data outputting unit, **1200-*n*: nth waveform data outputting unit, 1300, 1300A, 1300D: switching control unit, 1400, 1400A, 1400D: compression waveform data acquiring unit, 1400-1: first compression waveform data acquiring unit, 1400-2: second compression waveform data acquiring unit, 1400-*n*: nth compression waveform data acquiring unit, 1500, 1500A, 1500D: compression characteristic estimating unit, 1510: compression function differential value calculating unit, 1520: compression function value calculating unit, 1530: upsampling processing unit, 1540: upsampling processing unit, 1550: DAC temporal resolution acquiring unit, 1560: extraction unit, 1600: compression characteristic storing unit, 1700: ideal compression waveform acquiring unit, 1710: arbitrary waveform data acquiring unit, 1720: ADC temporal resolution acquiring unit, 1730: upsampling processing unit, 1740: ideal compression waveform generating unit, 1800, 1800A, 1800D: pre-equalization calculation unit, 1880: element array converting unit, 1890: pre-equalized waveform data calculating unit, 1900: compression characteristic estimation commanding unit, 2010: index (DAC data time timing), 2020: first waveform data for calibration, 2030: second waveform data for calibration, 2110: index value (sampling time timing value), 2120: first compression waveform data, 2130: second compression waveform data, 2190: compression characteristic estimation data, 2200: estimation processing, 2210: compression function differential value estimation result, 2220: compression function value estimation result, 2290: upsampling target, 2300: upsampling processing, 2310: index value (sampling time timing value after upsampling), 2320: compression function differential value (after upsampling), 2330: compression function value (after upsampling), 2390: upsampling result, 2410: index value (DAC data time timing), 2420: ideal compression waveform data, 2500: comparison processing, 2600: extraction processing, 2610: pre-equalized waveform data, 2620: index value (sampling time timing value), 3010: compression function (in case of linear compression), 3020: compression function (in case of nonlinear compression), 3110A: compression function value (actual), 3110B: compression function differential value (actual), 3120A: compression function value (estimated), 3120B: compression function differential value (estimated), 3130A: compression function value (linear interpolation estimation), 3130B: compression function differential value (linear interpolation estimation), 3210: compression transmission path input waveform (in case where there is no pre-equalization), 3220: compression transmission path input waveform (in case where there is pre-equalization), 3310: compression transmission path output waveform (in case where there is pre-equalization), 3320: compression transmission path output waveform (in case where there is no pre-equalization), 3330: ideal compression waveform, 10001: processor, 10002: memory, 10003: input and output interface, 20001: processing circuit, 20002: memory, 20003**: input and output interface

The invention claimed is:

1. A pre-equalized waveform generation device comprising:

a processor, and a memory storing a program, upon executed by the processor, to perform a process:

to output first waveform data for calibration and second waveform data for calibration represented by an expression having a different order of a time variable from an expression representing the first waveform data;

to acquire first compression waveform data indicating a waveform modulated using the first waveform data and compressed via a compression transmission path and to acquire second compression waveform data indicating a waveform modulated using the second waveform data and compressed via the compression transmission path;

to estimate a compression characteristic that is a characteristic of the compression transmission path by using the first compression waveform data and the second compression waveform data; and to calculate pre-equalized waveform data by using ideal compression waveform data generated on a basis of a signal waveform and the compression characteristic.

2. The pre-equalized waveform generation device according to claim 1, the process comprising to store the compression characteristic estimated, wherein the process acquires the compression characteristic.

3. The pre-equalized waveform generation device according to claim 1, wherein the process outputs three or more waveform data including the first waveform data and the second waveform data at different timings, the process acquires three or more compression waveform data including the first compression waveform data and the second compression waveform data at different timings, and the process estimates the compression characteristic by using the three or more compression waveform data including the first compression waveform data and the second compression waveform data.

4. The pre-equalized waveform generation device according to claim 1, wherein a waveform of the first waveform data is a waveform represented by a constant function, and a waveform of the second waveform data is a waveform represented by a linear function.

5. The pre-equalized waveform generation device according to claim 3, wherein a waveform of the first waveform data is a waveform represented by a constant function, a waveform of the second waveform data is a waveform represented by a linear function, the process further outputs third waveform data for calibration represented by a constant function different from the constant function representing the waveform of the first waveform data, the process further acquires third compression waveform data indicating a waveform modulated using the third waveform data and compressed via the compression transmission path, and the process estimates the compression characteristic that is the characteristic of the compression transmission path by using the first compression waveform data, the second compression waveform data, and the third compression waveform data.

6. The pre-equalized waveform generation device according to claim 3, wherein a waveform of the first waveform data is a waveform represented by a constant function, a waveform of the second waveform data is a waveform represented by a linear function, the process further outputs third waveform data for calibration represented by a linear function different from the linear function representing the waveform of the second waveform data, in addition to the first waveform data and the second waveform data, the process further acquires third compression waveform data indicating a waveform modulated using the third waveform data and compressed via the compression transmission path, and the process estimates the compression characteristic that is the characteristic of the compression transmission path by using the first compression waveform data, the second compression waveform data, and the third compression waveform data.

7. The pre-equalized waveform generation device according to claim 3, wherein the process further outputs third waveform data that is same waveform data as the first waveform data or the second waveform data, in addition to the first waveform data and the second waveform data, the process further acquires third compression waveform data indicating a waveform modulated using the third waveform data and compressed via the compression transmission path, and the process estimates the compression characteristic that is the characteristic of the compression transmission path by using the first compression waveform data, the second compression waveform data, and the third compression waveform data.

8. The pre-equalized waveform generation device according to claim 3, wherein a waveform of at least one waveform data of the three or more waveform data including the first waveform data and the second waveform data is a waveform represented by a function having a second or higher order.

9. The pre-equalized waveform generation device according to claim 1, the process further comprising to cause output of the pre-equalized waveform data to be stopped depending on a signal acquired from outside of the pre-equalized waveform generation device, and to cause the process to output calibration waveform data, and to cause the process to calculate the compression characteristic, and to cause the compression characteristic used for processing of the process to be updated.

10. The pre-equalized waveform generation device according to claim 3, the process further comprising to cause output of the pre-equalized waveform data to be stopped depending on a signal acquired from outside of the pre-equalized waveform generation device, and to cause the process to output calibration waveform data, and to cause the process to calculate the compression characteristic, and to cause the compression characteristic used for processing of the process to be updated.

11. The pre-equalized waveform generation device according to claim 1, wherein by using a compression function differential value obtained by upsampling a differential value of a compression function indicating a time change in an expression representing an output waveform with reference to the compression transmission path by an input waveform, a sampling time timing of input waveform data indicating the input waveform, a compression function value obtained by upsampling a value of the compression function, and a sampling time timing of the upsampled compression function value, the process extracts the sampling time timing after upsampling corresponding to the sampling time timing of the input waveform data, and outputs the compression characteristic including the compression function differential value at the extracted sampling time timing, and the process calculates the pre-equalized waveform data by dividing the ideal compression waveform data by the compression function differential value for each of the sampling time timings extracted.

12. A waveform compression device including an intensity modulator and a compression transmission path and to compress a waveform modulated by the intensity modulator via the compression transmission path, the waveform compression device comprising:

a processor; and a memory storing a program, upon executed by the processor, to perform a process:

to output, to the intensity modulator, first waveform data for calibration and second waveform data for calibration represented by an expression having a different order of a time variable from an expression representing the first waveform data;

a distributor disposed at a subsequent stage of the compression transmission path;

to acquire, via the distributor, first compression waveform data indicating a waveform modulated by the intensity modulator using the first waveform data and compressed via the compression transmission path and to acquire, via the distributor, second compression waveform data indicating a waveform modulated by the intensity modulator using the second waveform data and compressed via the compression transmission path;

to estimate a compression characteristic that is a characteristic of the compression transmission path by using the first compression waveform data and the second compression waveform data; and to generate ideal compression waveform data indicating an ideal compression waveform on a basis of a signal waveform and to calculate pre-equalized waveform data by using the compression characteristic and the ideal compression waveform data.

13. A pre-equalized waveform generation method comprising:

outputting first waveform data for calibration and second waveform data for calibration represented by an expression having a different order of a time variable from an expression representing the first waveform data;

acquiring first compression waveform data indicating a waveform modulated using the first waveform data and compressed via a compression transmission path and acquiring second compression waveform data indicating a waveform modulated using the second waveform data and compressed via the compression transmission path;

estimating a compression characteristic that is a characteristic of the compression transmission path by using the first compression waveform data and the second compression waveform data; and calculating pre-equalized waveform data by using ideal compression waveform data generated on a basis of a signal waveform and the compression characteristic.

* * * * *